US012240555B2

(12) United States Patent
Navarro Baeza

(10) Patent No.: US 12,240,555 B2
(45) Date of Patent: Mar. 4, 2025

(54) POWER SUPPLY IN BICYCLE AXLE

(71) Applicant: SRAM, LLC, Chicago, IL (US)

(72) Inventor: Miguel Navarro Baeza, Chicago, IL (US)

(73) Assignee: SRAM, LLC, Chicago, IL (US)

( * ) Notice: Subject to any disclaimer, the term of this patent is extended or adjusted under 35 U.S.C. 154(b) by 378 days.

(21) Appl. No.: 17/551,601

(22) Filed: Dec. 15, 2021

(65) Prior Publication Data
US 2022/0194509 A1 Jun. 23, 2022

Related U.S. Application Data

(60) Provisional application No. 63/127,569, filed on Dec. 18, 2020.

(51) Int. Cl.
*B62J 43/30* (2020.01)
*B62M 25/08* (2006.01)
*H05K 7/14* (2006.01)

(52) U.S. Cl.
CPC .............. *B62J 43/30* (2020.02); *B62M 25/08* (2013.01); *H05K 7/1427* (2013.01)

(58) Field of Classification Search
CPC ........ B62J 43/30; B62M 25/08; B62M 9/122; H05K 7/1427; B62K 25/02
See application file for complete search history.

(56) References Cited

U.S. PATENT DOCUMENTS

| | | | | |
|---|---|---|---|---|
| 5,551,315 | A * | 9/1996 | Pikoulas | B62M 25/08 |
| | | | | 280/238 |
| 6,899,649 | B2 * | 5/2005 | Ichida | B62M 25/04 |
| | | | | 474/70 |
| 9,381,974 | B2 * | 7/2016 | Katsura | B62M 9/132 |
| 9,671,098 | B2 * | 6/2017 | Maglica | F21V 23/0421 |
| 9,676,444 | B2 * | 6/2017 | Shipman | B62M 9/124 |
| 9,963,197 | B2 * | 5/2018 | Watarai | B62J 43/30 |
| 10,442,488 | B2 * | 10/2019 | Kakinoki | B62K 19/40 |
| 10,981,626 | B2 * | 4/2021 | Braedt | B62M 9/12 |
| 11,772,746 | B2 * | 10/2023 | Van Druten | B62M 25/08 |
| | | | | 74/501.6 |

FOREIGN PATENT DOCUMENTS

| | | | | |
|---|---|---|---|---|
| CN | 110271636 | | 9/2019 | |
| DE | 102015009922 | A1 * | 2/2016 | ............. B62J 43/30 |
| DE | 102016000498 | A1 * | 7/2016 | ............. B62J 45/412 |
| DE | 102018126435 | | 5/2019 | |
| DE | 102018126435 | A1 * | 5/2019 | ............. B62K 25/02 |

(Continued)

*Primary Examiner* — James A Shriver, II
*Assistant Examiner* — Michael T. Walsh

(57) ABSTRACT

A power supply for a bicycle component includes an energy storage unit positionable in an axle of the bicycle. The energy storage unit has a first electrical contact and a second electrical contact spaced apart from the first electrical contact. The power supply further includes a connector configured to electrically and mechanically connect the energy storage unit to the component of the bicycle, a first conductive path extending from the energy storage unit to the component of the bicycle via the first electrical contact and the connector, and, a second conductive path extending from the energy storage unit to the component of the bicycle via the second electrical contact and the connector.

10 Claims, 21 Drawing Sheets

(56) References Cited

FOREIGN PATENT DOCUMENTS

| TW | I374565 | 10/2012 | | |
|----|---------|---------|---|---|
| TW | 201604072 | 2/2016 | | |
| TW | I616375 | 3/2018 | | |
| TW | 201922578 | 6/2019 | | |
| WO | 2018199761 | 11/2018 | | |
| WO | WO-2018199761 A1 * | 11/2018 | .............. | B62J 45/41 |

* cited by examiner

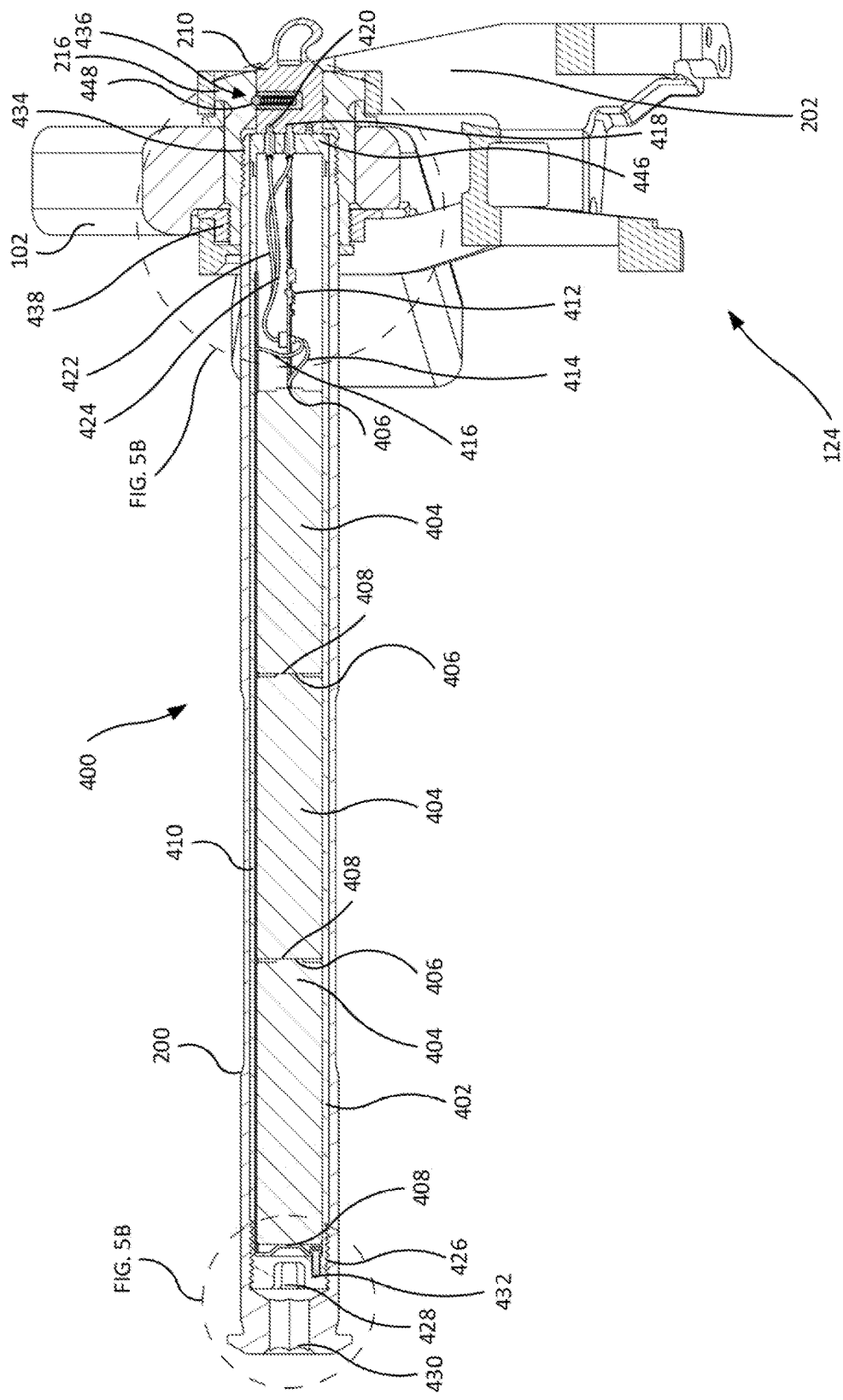

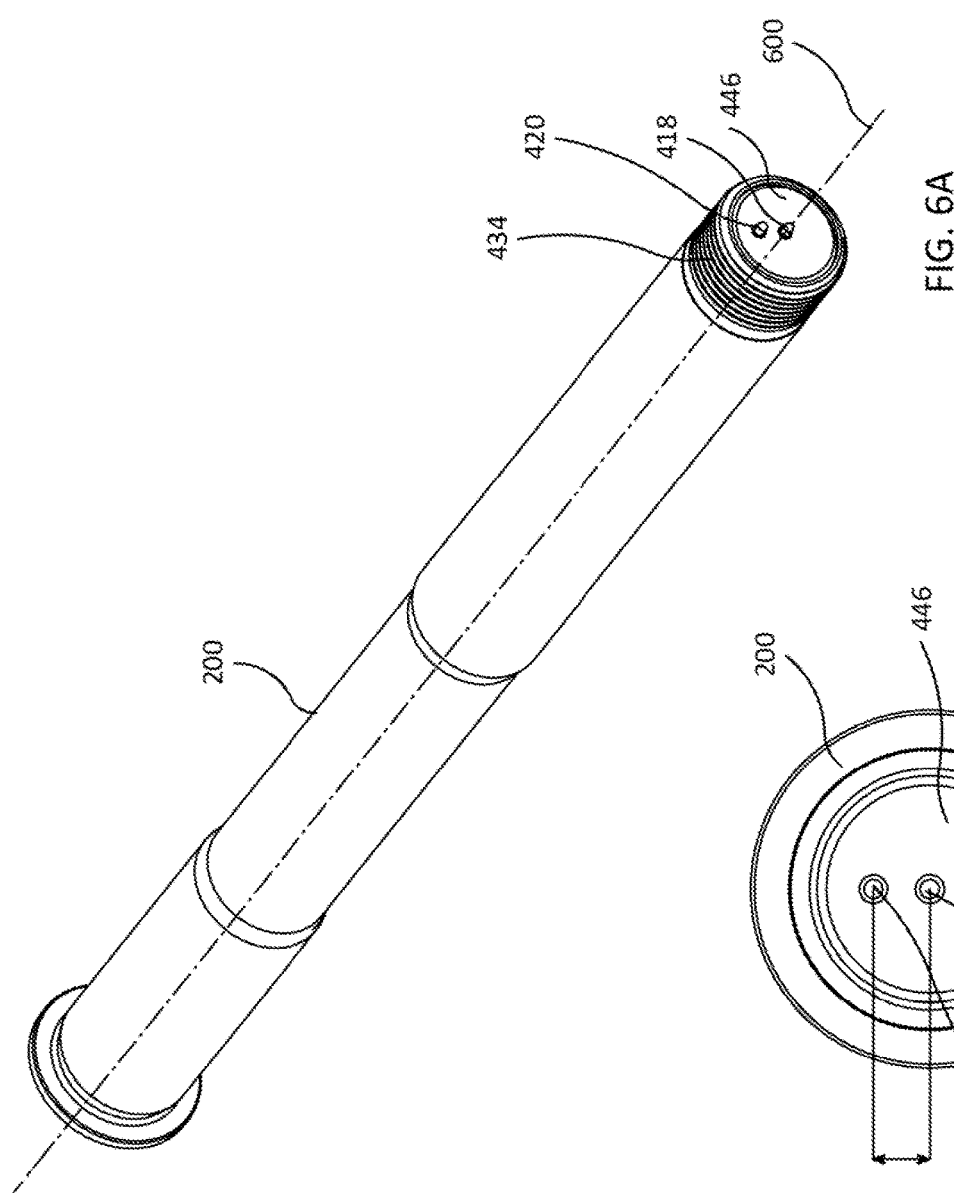

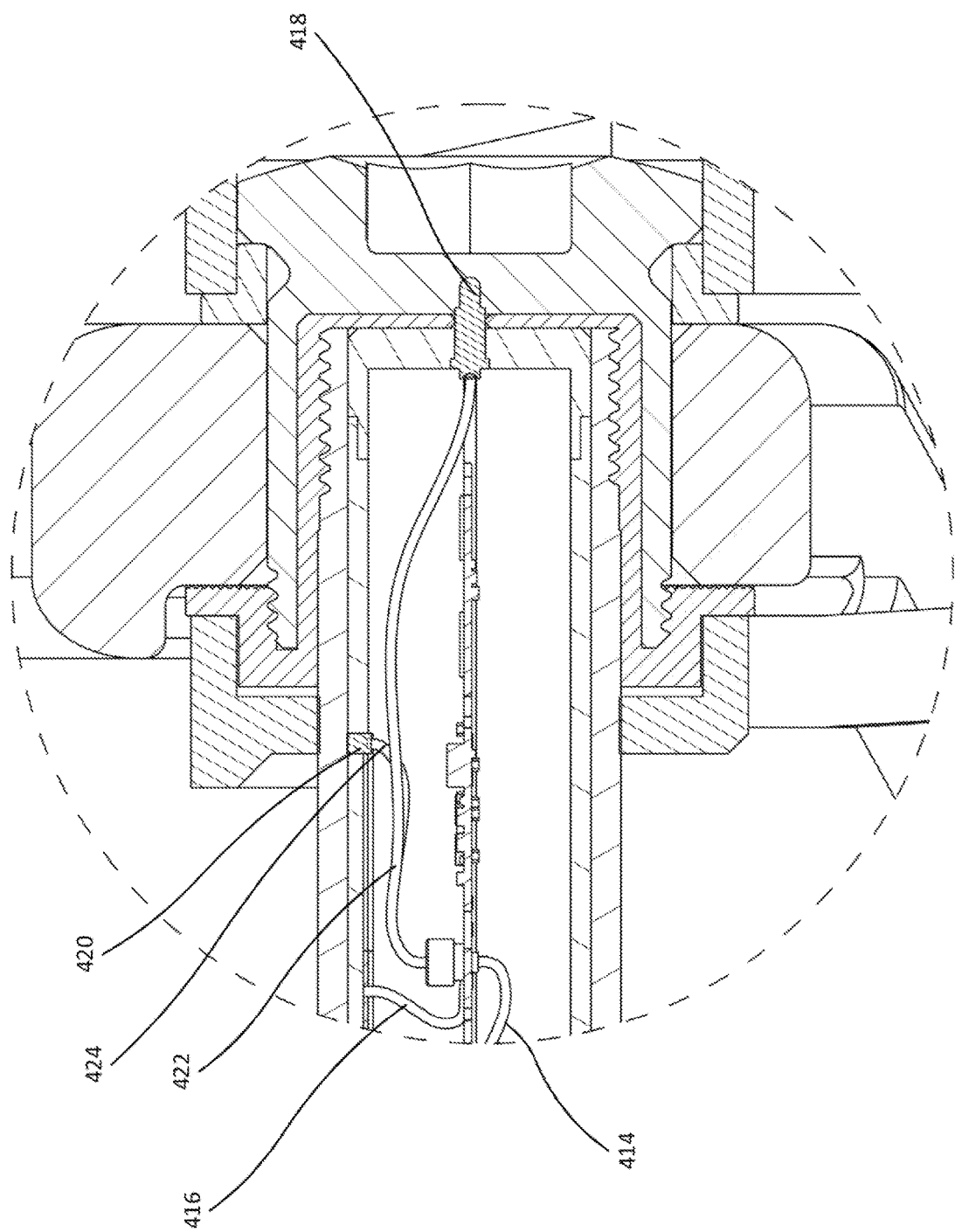

POWER SUPPLY IN BICYCLE AXLE

PRIORITY

This application claims the benefit of U.S. Provisional Patent Application No. 63/127,569, filed Dec. 18, 2020 the contents of which are hereby incorporated by reference in their entirety.

FIELD OF THE DISCLOSURE

The present disclosure is generally directed to a power supply system for a bicycle.

DESCRIPTION OF THE RELATED ART

Bicycles may have electronic components that are powered by a power supply. For example, a derailleur may be powered by a battery pack. Other bicycle components may be powered by the power supply, for example, an adjustable seat post. The power supply may be mounted on or otherwise attach to the electronic components, such as the derailleur.

SUMMARY

In one example, a power supply system for a component of a bicycle includes an energy storage unit positionable in an axle of the bicycle, the energy storage unit including a first electrical contact and a second electrical contact spaced apart from the first electrical contact, a connector configured to electrically and mechanically connect the energy storage unit to the component of the bicycle, a first conductive path extending from the energy storage unit to the component of the bicycle via the first electrical contact and the connector, and a second conductive path extending from the energy storage unit to the component of the bicycle via the second electrical contact and the connector.

In one example, the energy storage unit includes a housing, in which the energy storage unit is positionable, and the first electrical contact and the second electrical contact are supported by the housing.

In one example, the first electrical contact and the second electrical contact are supported by the housing of the energy storage unit at an axial end of the housing of the energy storage unit, and the connector is connectable to the first electrical contact and the second electrical contact at the axial end of the housing.

In one example, the energy storage unit is positionable in the axle of the bicycle, such that the first electrical contact is disposed coaxially with the axle of the bicycle, and the second electrical contact is supported by the housing of the energy storage unit at a radial distance spaced apart from the first electrical contact.

In one example, the first electrical contact and the second electrical contact extend beyond the axial end of the housing.

In one example, the first electrical contact and the second electrical contact are laterally disposed between a first plane defined by a first outer surface of a mounting support for the component and a second plane defined by a second outer surface of the mounting support opposite the first outer surface.

In one example, the first electrical contact is disposed at a circumferential surface of the housing of the energy storage unit.

In one example, the power supply system includes the axle of the bicycle, the axle having a circumferential surface and the first electrical contact is in electrical communication with a portion of the circumferential surface of the axle.

In one example, the portion of the circumferential surface of the axle is a non-anodized portion of the circumferential surface of the axle.

In one example, the connector is electrically connectable to the energy storage unit via the axle, a fixing member of the axle, or the axle and the fixing member of the axle.

In one example, the energy storage unit of the power supply system includes a printed circuit board disposed within and supported by the housing of the energy storage unit and a power management circuit supported by the printed circuit board and electrically connectable to a power source of the energy storage unit.

In one example, one end of the connector includes an interface that supports a first annular electrical contact and a second annular electrical contact, the second annular electrical contact being radially outer relative to the first annular electrical contact, and the connector is physically connectable to the energy storage unit, such that the first annular electrical contact of the connector abuts the first electrical contact of the energy storage unit, the second annular electrical contact of the connectors abuts the second electrical contact of the energy storage unit, and the energy storage unit is electrically connected to the connector.

In one example, the interface of the connector comprises a retaining feature configured to mechanically couple the interface to the axle.

In one example, the connector is electrically connectable to an input electrical contact of the component of the bicycle.

In one example, a power supply for a bicycle component includes a housing that is positionable within an axle of the bicycle, the housing being configured to support one or more power sources, a first electrical contact and a second electrical contact spaced apart from the first electrical contact, the first electrical contact and the second electrical contact being supported by the housing. The one or more power sources are electrically connectable to the bicycle component via a first conductive path and a second conductive path, the first conductive path extends from the one or more power sources to the bicycle component, via the first electrical contact, and the second conductive path extends from the one or more power sources to the bicycle component, via the second electrical contact.

In one example, the battery comprises a first electrical contact and a second electrical contact, the first electrical contact is disposed at an axial end of the battery, and the energy transfer device is electrically connected to the first contact point and the second contact point at the axial end of the battery pack.

In one example, the second electrical contact is disposed at the axial end of the battery pack at a radial distance from an axis of the thru-axle, the energy transfer device is electrically connected to the second contact point at the axial end of the battery pack, and the first electrical contact is disposed coaxially with the thru-axle.

In one example, the second electrical contact is disposed at a circumferential surface of the battery and extends beyond the circumferential surface.

In one example, derailleur assembly for a bicycle includes a derailleur, an energy storage unit positionable in an axle of the bicycle, the energy storage unit including a first electrical contact and a second electrical contact spaced apart from the first electrical contact, and a connector configured to electrically connect the energy storage unit to the derailleur. A first conductive path extends from the energy storage unit to the derailleur via the first electrical contact and the connector and a second conductive path extends from the energy storage unit to the derailleur via the second electrical contact and the connector.

In one example, the battery pack comprises a first electrical contact and a second electrical contact, the first electrical contact and the second electrical contact are disposed at an axial end of the battery pack, and the electrical connector is electrically coupled to the first contact point and the second contact point at an axial end of the battery pack.

In one example, the first electrical contact is disposed at an axial end of the battery pack coaxially with the thru-axle, and the second electrical contact is disposed at the axial end of the battery pack at a radial distance from an axis of the thru-axle or at a circumferential surface of the battery pack.

BRIEF DESCRIPTION OF THE DRAWINGS

Objects, features, and advantages of the present invention will become apparent upon reading the following description in conjunction with the drawing figures, in which:

FIG. 4 is a cross-sectional view of the thru-axle power supply and bracket of FIG. 3;

FIG. 6A is a perspective view of the thru-axle power supply of FIG. 2 without the bracket or derailleur installed;

FIG. 6B is a front view of axle power supply of FIG. 2 without the bracket or derailleur installed;

FIG. 16 is a detail view of the thru-axle power supply and bracket of FIG. 15;

DETAILED DESCRIPTION OF THE DISCLOSURE

A power supply may provide power to one or more bicycle components. For example, the power supply may provide power to a derailleur, seat post, bicycle lighting, an air pump, a GPS transponder, a shock, or other component. Traditional power supplies may be mounted on or supported by the component. In this way, the traditional power supplies may add unbalanced weight to the bicycle. Additionally, the traditional power supplies may be exposed to water, dust, and impacts. Traditional power supplies may also have limited capacity. For example, the traditional power supplies may be limited in size to reduce unbalanced weight or reduce likelihood of impacts, thereby limiting the capacity of the power supply. Because the traditional power supplies may attach directly to the bicycle component, the power supply may not be charged while installed on the bicycle and may require removal before charging.

A power supply system including a power supply positioned inside an axle of the bicycle may provide a solution to one or more of the problems described above. The power supply may be disposed or mountable in an axle of the bicycle. For example, the power supply may be disposed, mountable, or integrated in an axle of the bicycle. The axle may be a front axle or a rear axle. In some cases, the axle may be referred to as a "thru-axle." Because the axle extends across the bicycle, the weight of the axle power supply is balanced across the bicycle. Further, because a substantial portion of the axle is disposed within the frame, the axle power supply may be protected from impacts. In some cases, the axle may be a tube. By disposing the power supply in the axle, the power supply may be protected from ingress of water and dust. Though the power supply may be disposed in the axle, the power supply or a connector in electric communication with the power supply may be accessible to a user so that, for example, the power-supply may be charged without removing the power supply from the bicycle. Alternatively, the power supply may include disposable batteries that may be replaced by the user.

Figure 1:
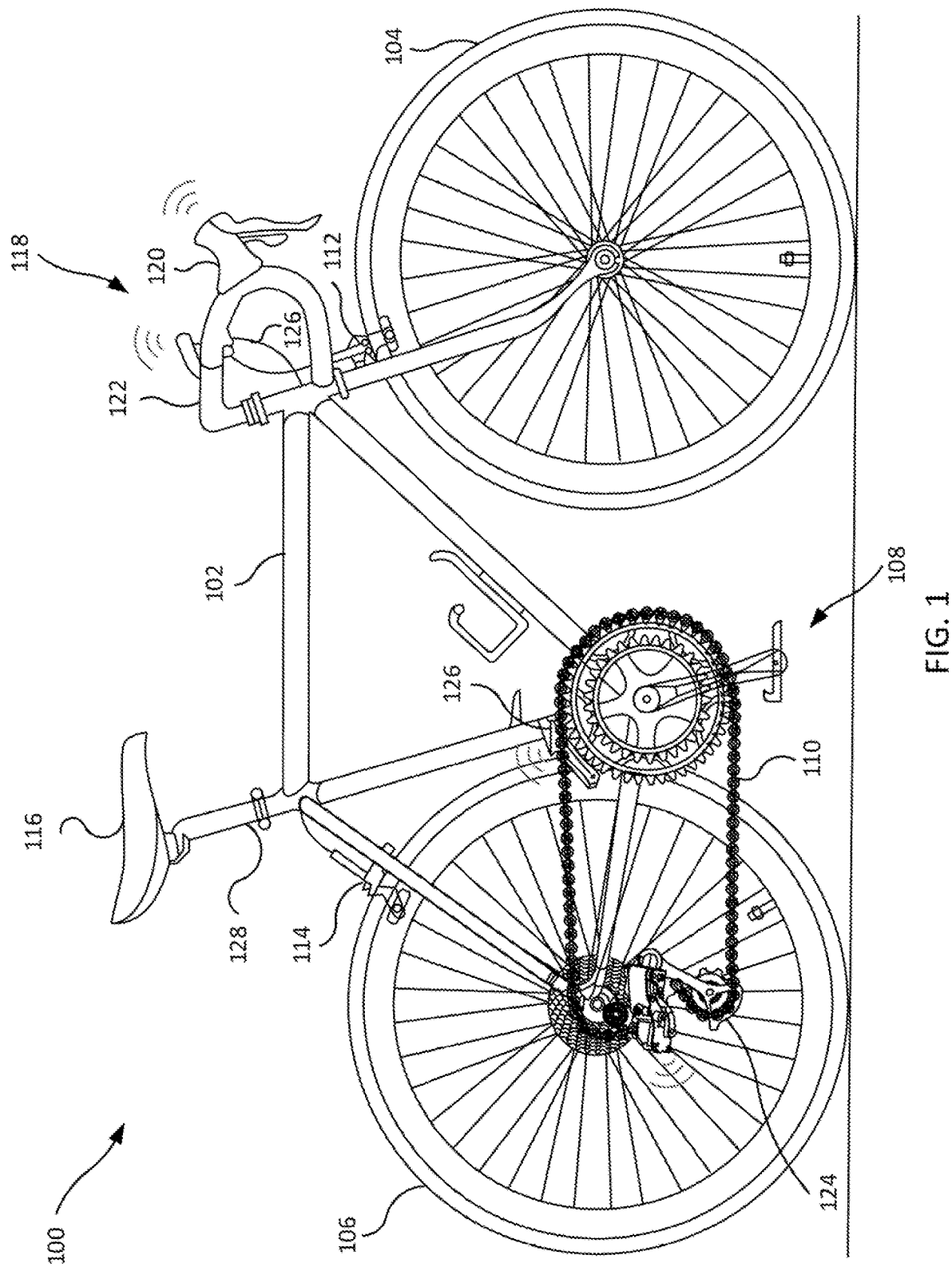
FIG. 1 is a side view schematic of a bicycle having a power supply system in accordance with the teachings of this disclosure.

Turning now to the drawings, FIG. 1 generally illustrates one example of a bicycle 100 on which a power supply system (shown in FIG. 4) of one or more of the present embodiments may be installed. In the example shown, the bicycle 100 is a road bicycle. The bicycle 100 has a frame 102 supported on a front wheel 104 and a rear wheel 106. A drivetrain 108 is arranged to provide power to the rear wheel 106 via a chain 110. A front brake 112 and a rear brake 114 are arranged to slow rotation of the front wheel 104 and the rear wheel 106, respectively. A saddle 116 is provided to support the rider during use of the bicycle 100. The saddle 116 may be supported by a seat post 128 extending from the frame 102. Further, a handlebar assembly 118 is arranged to control a direction of the front wheel 104 and communicate with the drivetrain 108, the front brake 112, and the rear brake 114 to control operation thereof.

It is to be understood that the specific arrangement and illustrated components of the frame 102, front wheel 104, rear wheel 106, drivetrain 108, front brake 112, rear brake 114, and saddle 116 are nonlimiting to the disclosed embodiments. For example, while the front brake 112 and the rear brake 114 are illustrated as hydraulic rim brakes, hydraulic disc brakes are contemplated and encompassed within the scope of the disclosure.

While the bicycle 100 depicted in FIG. 1 is a road bicycle, the power supply, including the specific embodiments and examples disclosed herein as well as alternative embodiments and examples, may be implemented on other types of bicycles. For example, the disclosed power supply may be used on mountain bicycles.

The handlebar assembly 118 includes a handlebar 122 and one or more hoods 120. Typically, components supported by a hood 120 installed on a right side of the handlebar 122 controls operation of a rear derailleur 124 (e.g., part of the drivetrain 108) and the rear brake 114, while components supported by a hood 120 installed on a left side of the handlebar 122 controls a front derailleur 126 (e.g., part of the drivetrain 108) and the front brake 112. Other components and controls may be provided. The derailleurs 124, 126 may be configured for wired or wireless operation. For example, the derailleurs may be configured to receive a gear shift signal from a remote shift control device or shift module. The illustrated handlebar 122 is a drop-style handlebar. In other embodiments, different handlebar styles may be employed. For example, the handlebar 122 may be a bullhorn handlebar, a flat handlebar, a riser handlebar, or another type of handlebar. A center of the handlebar 122 may be defined by a line or axis extending along the length of the handlebar 122.

Figure 2:
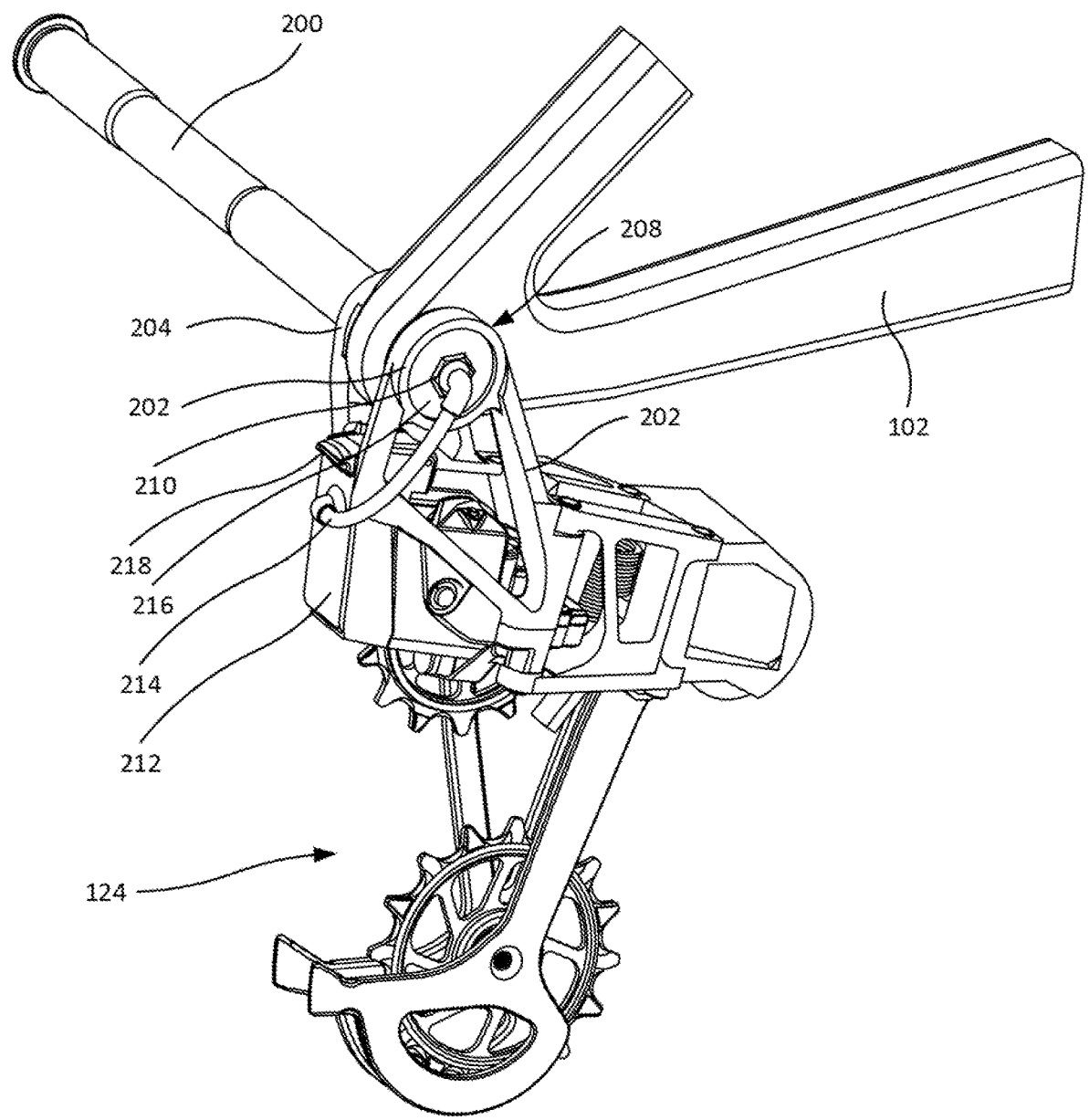
FIG. 2 is a perspective view of a thru-axle power supply, bracket, and derailleur in accordance with the teachings of this disclosure.

Referring to FIG. 2, a derailleur 124 and the power supply system are shown in greater detail. The power supply system includes a power supply disposed within a thru-axle 200. The derailleur 124 is mounted on the frame 102 via a bracket 202. The bracket 202 may have an inboard mounting portion 204 and an outboard mounting portion 206 disposed on either side of the frame 102. A connector 208, also known as an energy transfer device, extends from the power supply to the derailleur 124. The connector 208 may include a power supply interface 210, a component interface 212, and a cable 214 extending between the power supply interface 210 and the component interface 212. The connector 208 (e.g. the power supply interface 210) may fit within a first fixation member 216 for connection to the power supply. The connector 208 (e.g. the component interface 212) may be secured to the derailleur 124 via a second fixation member 218. Other configurations may be provided.

The bracket 202, also known as a "knuckle" or "b-knuckle," may be secured to the frame 102 of the bicycle. The inboard mounting portion 204 of the bracket 202 may be spaced apart from the outboard mounting portion 206 of the bracket 202. The spacing between the inboard mounting portion 204 and the outboard mounting portion 206 may allow for the frame 102 of the bicycle to be inserted between the mounting portions 204, 206. The spacing between the mounting portions 204, 206 may be along an axis (e.g. a central axis) of the thru-axle 200. In some cases (e.g. where the derailleur 124 is a front derailleur), the bracket 202 may be omitted or may have no or only one of the mounting portions 204, 206. In some other cases, the bracket 202 may be integrated with the derailleur 124.

By disposing the bracket 202 on either side of the frame 102, an inner diameter of the thru-axle 200 may be enlarged as compared to conventional derailleur mounts and hangers. The larger inner diameter of the thru-axle 200 may allow for a larger power supply to be disposed therein.

The connector 208 may be configured to conduct electricity into and out of the power supply. For example, the connector 208 may conduct power between the power supply and a component, such as a derailleur 124. The power supply may provide power to the component through the connector 208. In another example, the connector 208 may conduct power between the power supply and a charging unit. The power supply may be charged via power supplied by the charging unit through the connector 208.

The power supply interface 210 of the connector 208 may be in electrical communication with the power supply. The power supply interface 210 may connect to the power supply and enable the transmission of power and data into the power supply (e.g. from a charger) and out of the power supply (e.g. to the component via the connector 208). The power supply interface 210 may have one or more electrical contacts. For example, the power supply interface 210 may have a first electrical contact disposed at a center of a face of the power supply interface 210. Though the power supply interface 210 may include electrical contacts, in some cases a body of the power supply interface 210 may be made from a non-conductive or electrically insulating material. The center of the power supply interface 210 may align with a central axis of the power supply or the thru-axle 200 when installed on the power supply. The electrical contacts of the power supply interface 210 are shown in greater detail in FIG. 10. The first electrical contact may be in electrical communication with an electrical contact of the power supply when the power supply interface 210 is installed on the power supply. In some cases, the power supply interface 210 may include a second electrical contact. The second electrical contact may be disposed at a radial distance from the first electrical contact of the power supply interface 210.

When installed on the power supply, the power supply interface 210 may extend through the first fixation member 216. For example, the first fixation member 216 may have an annular shape. The power supply interface 210 may be disposed in the annular space and contact the power supply. In some cases, the power supply interface 210 may be secured to the fixation member 216 by a retaining feature.

The component interface 212 of the connector 208 may be in electrical communication with the component of the bicycle. For example, the component interface 212 may be in electrical communication with the derailleur 124. The component interface 212 may connect to the component and enable the transmission of power and data into the component (e.g. from the power supply via the connector 208) and out of the component. The component interface 212 may take the place of or be compatible with a traditional battery pack that attaches to the component. For example, for a derailleur 124 that receives power from a battery pack mounted to the derailleur 124, the component interface 212 may attach to the derailleur 124 in the same manner as the battery pack. In other words, the component interface 212 may be compatible with existing battery-powered systems and components. The second fixation member 218 may be disposed on the component and secure the component interface 212 to the component.

The cable 214 of the connector 208 may be electrically connected to the power supply interface 210 and the component interface 212. One or more conductors may be present in the cable 214. For example, one or more conductive wires may be disposed in the cable 214. The one or more conductors of the cable 214 may be electrically connected with the power supply interface 210 and the component interface 212. The cable 214 may transmit power between the power supply interface 210 and the component interface 212. For example, the power supply may provide power to the connector 208 via the power supply interface 210, and the cable 214 may conduct the power to the component interface 212 and ultimately to the component. In another example, a charger may provide power via the component interface 212, and the cable 214 may conduct the power to the power supply interface 210 and ultimately to the power supply.

The fixation member 216 may secure the thru-axle 200 in place relative to the frame 102. In some cases, the fixation member 216 may be threadedly engaged with the thru-axle 200. The fixation member 216 may have a hole or annular space extending through the width of the fixation member 216. The power supply interface 210 may connect to the power supply through the annular space. In some cases, the fixation member 216 may be made from a non-conductive or electrically insulating material. In some other cases (e.g. as in FIGS. 11-21), the fixation member 216 may be made from an electrically conductive material.

The second fixation member 218 may secure the component interface 212 to the component. In some cases, the fixation member 218 may be disposed on the component. For example, the fixation member 218 may be disposed on the derailleur 124 or the bracket 202. The fixation member 218 may interface with the component interface 212. For example, the fixation member 218 may clip onto the component interface 212.

Figure 3:
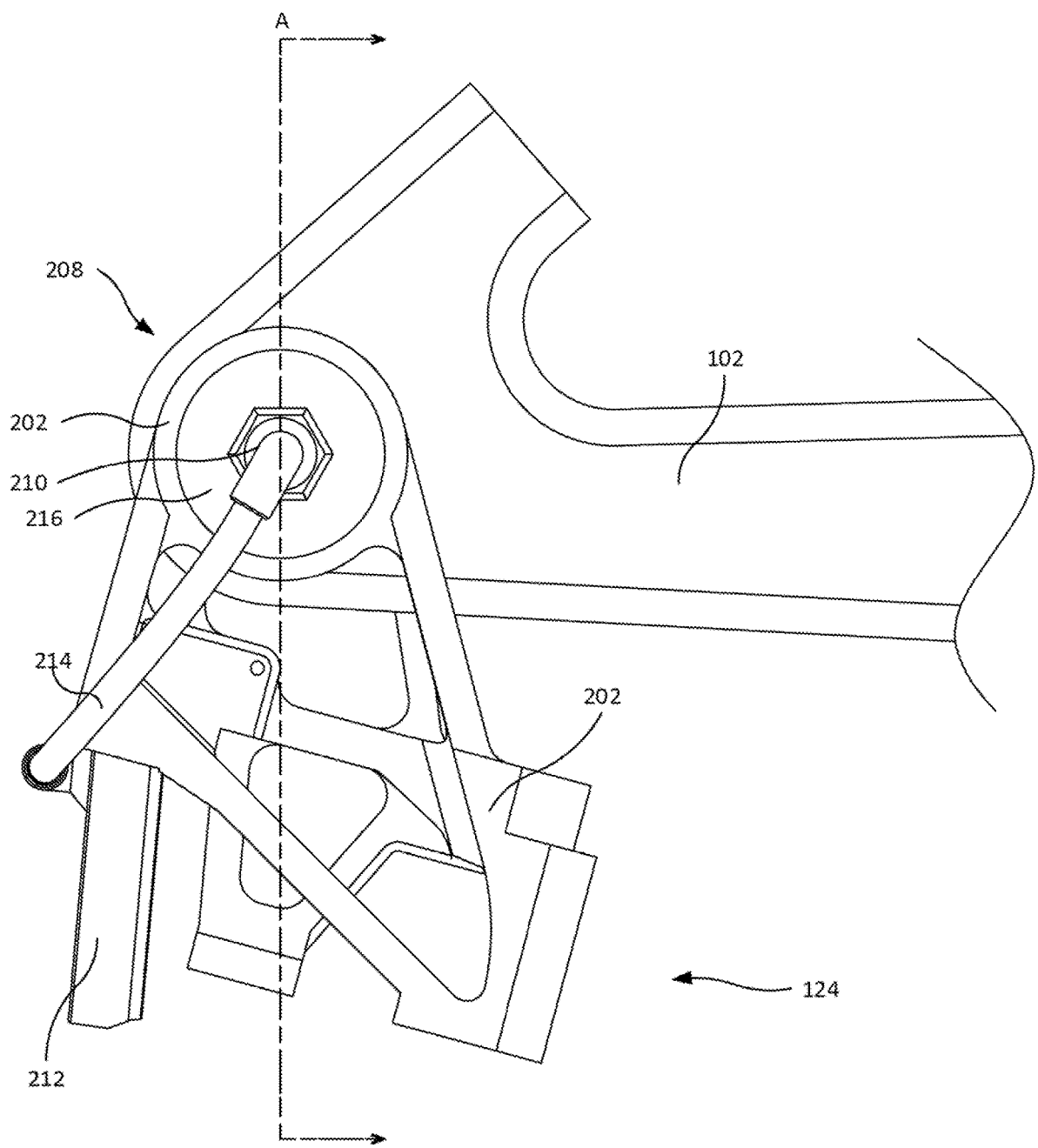
FIG. 3 is a side view of the thru-axle power supply and bracket of FIG. 2 without the derailleur installed.
Figure 5A:
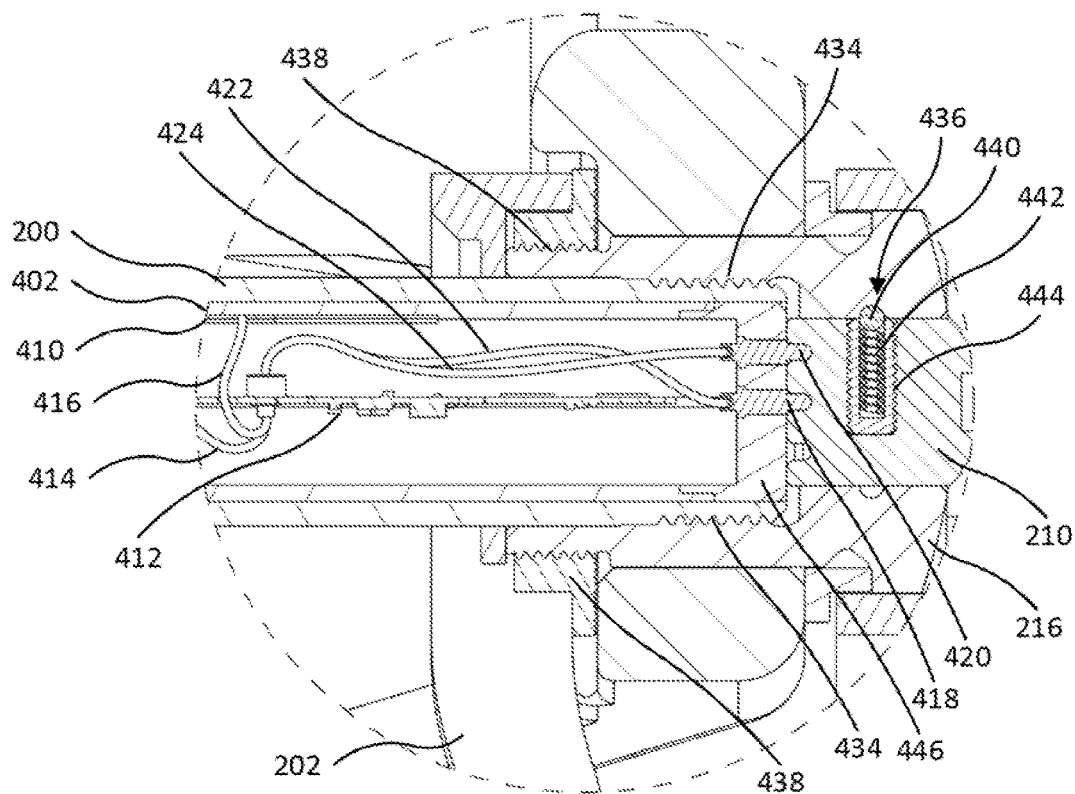
FIG. 5A is first a detail view of the thru-axle power supply and bracket of FIG. 4.
Figure 5B:
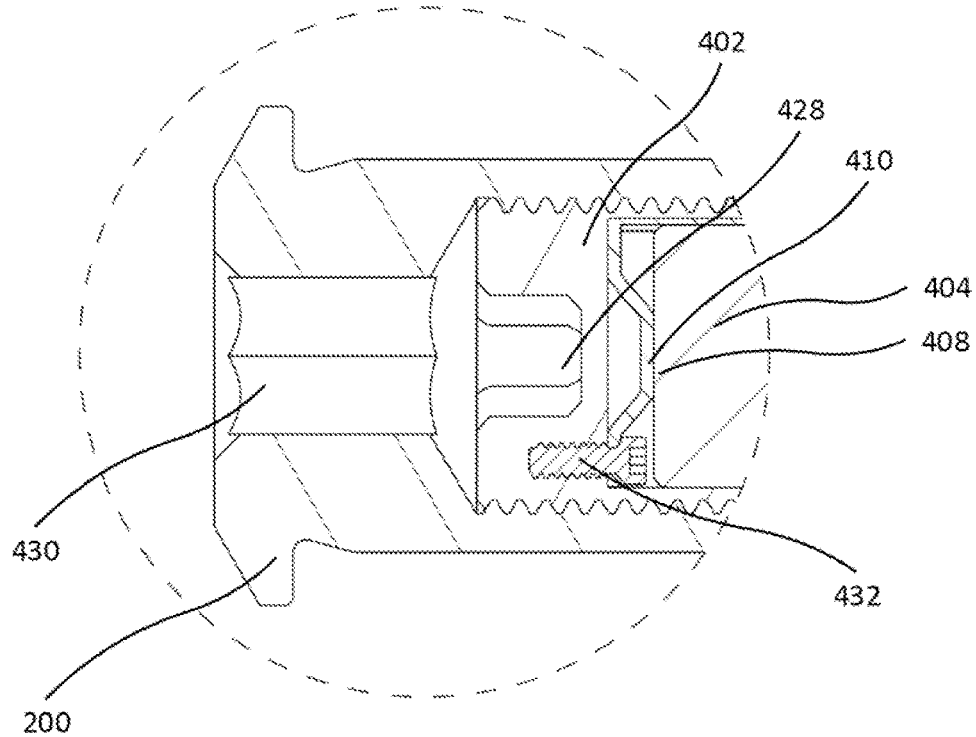
FIG. 5B is first a detail view of the thru-axle power supply and bracket of FIG. 4.

FIGS. 3, 4, 5A, 5B, and 8 show the bracket 202, a power supply 400, and the connector 208 in greater detail. A cross section A of FIG. 3 is shown in FIG. 4.

The power supply 400, also known as an energy storage unit, battery pack, or power source, may be disposed in the thru-axle 200. The power supply 400 may have a housing 402 with one or more battery cells 404 disposed therein. The power supply 400 and/or the housing 402 may have a cylindrical shape. In some cases, the housing 402 may be made from a non-conductive or electrically insulating material.

Each of the cells 404 may have a positive terminal 406 and a negative terminal 408. In some cases, a conductive plate 410 may extend from the negative terminal 408 of a first cell 404 of the cells 404. A circuit board 412 may be disposed in the housing 402. In some cases, the cells 404 may use a lithium ion battery chemistry. The cells 404 may use a standard type, shape, or specification. For example, the cells 404 may be "AAA" type cells. Each cell 404 may have a voltage of 3.7 volts and/or a capacity of 350 mAh. Because of the space available inside the thru-axle 200, the cells 404 may have a greater capacity than traditional batteries for bicycle components. The cells 404 may be connected end-to-end. The end-to-end arrangement of the cells 404 may form a linear power supply. In some cases, a welding strip may be present between the terminals 406, 408 of adjacent cells 404. The welding strip may be made from any number of materials, for example, nickel.

A first electrical conductor 414 may extend from the positive terminal 406 of a last cell 404 (e.g. the third cell) of the cells 404 to the circuit board 412. A second electrical conductor 416 may extend from the negative terminal 408 of the first cell 404 or the conductive plate 410 to the circuit board 412. A first electrical contact 418, a second electrical contact 420, or the first electrical contact 418 and the second electrical contact 420 may be disposed on and/or in the housing 402. For example, the electrical contacts 418, 420 may be disposed at an axial end of the housing 402. In some cases, the first electrical contact 418 and/or the second electrical contact 420 may extend beyond an end cap 446 of the housing 402. The first electrical contact 418 and the second electrical contact 420 may be disposed in line with the frame 102. For example, the first electrical contact 418 and the second electrical contact 420 may be laterally disposed between a first plane defined by a first outer surface of a mounting support (e.g. an inner surface of the frame 102) for the component and a second plane defined by a second outer surface of the mounting support (e.g. an outer surface of the frame 102) opposite the first outer surface. The first electrical contact 418 and/or the second electrical contact 420 may be retractable. For example, the first electrical contact 418 and/or the second electrical contact 420 may be spring loaded pins or "pogo pins."

A third electrical conductor 422 may extend between the circuit board 412 and the first electrical contact 418. A fourth electrical conductor 424 may extend between the circuit board 412 and the second electrical contact 420. An input side of the circuit board 412 may interface with the cells 404 of the power supply, for example, via the first electrical conductor 414 and the second electrical conductor 416 A power management circuit of the circuit board 412 may be electrically connected to the first electrical conductor 414 and the second electrical conductor 416 on the input side. An output side of the circuit board 412 may interface with devices (e.g. the connector 208 or a charger) external to the power supply, for example, via the third electrical conductor 422 and the fourth electrical conductor 424. The power management circuit may be electrically connected to the third electrical conductor 422 and the fourth electrical conductor 424 on the output side.

The housing 402 may be secured in the thru-axle 200 via a first engagement 426. For example, the first engagement 426 may be a threaded engagement between the housing 402 and the thru-axle 200. In another example, the engagement 426 may be a press fit or other type of engagement. The housing 402 may be screwed into the thru-axle 200 and be secured in place by the threaded engagement 426. A tooled fitting 428 may be disposed on the housing 402. For example, the tooled fitting 428 may be disposed at an end of the housing 402. The tooled fitting may be accessible via an aperture 430 in the thru-axle 200. The tooled fitting 428 may allow for engagement and disengagement between the housing 402 and the thru-axle 200. For example, the tooled fitting 428 may allow for a driver to be inserted into the tooled fitting 428. In some cases, the tooled fitting 428 may have a hexagonal profile. Rotation or other motion of the tooled fitting 428 may result in engagement or disengagement of the first engagement 426 between the housing 402 and the thru-axle 200.

A fastener 432 may secure the conductive plate 410 to the housing 402. The fastener 432 may be disposed at an end of the housing 402. In some cases, the fastener 432 may be threadedly engaged with the housing 402. In some other cases, the conductive plate 410 may be connected to the housing 402 by welding or another connection.

The circuit board 412 may be disposed within the housing 402. In this way, the housing 402 may support the circuit board 412. The circuit board 412 may include one or more components or sensors. For example, the circuit board 412 may include a battery or power management circuit. The power management circuit may be electrically connected to or in electric communication with the battery cells 404. The power management circuit may manage the charging and discharging of the power supply 400 (and the battery cells 404). In another example, the circuit board 412 may include a radio, a temperature sensor, an accelerometer, a cadence sensor, an RPM sensor, a wheel speed sensor, a speed sensor, a power meter, a GPS sensor, other components, or any combination thereof.

The thru-axle 200 may be secured to the fixation member 216 via a second engagement 434. For example, the second engagement 434 may be a threaded engagement between the thru-axle 200 and the fixation member 216. The second engagement 434 may be any other type of connection.

The fixation member 216 may be secured to the frame 102 via an inboard retainer 438. For example, the fixation member 216 may threadedly engage with the inboard retainer 438. The inboard retainer 438 may be disposed opposite the fixation member 216. For example, the inboard retainer 438 may be disposed inboard of the frame 102. In some cases, the inboard retainer 438 is a nut.

The power supply interface 210 may be secured in place (e.g. to the fixation member 216) by a retaining feature 436. The retaining feature 436 may include a retractable member 440. The retractable member 440 may be operated by a bias element 442. For example, the bias element 442 may bias the retaining feature 436 to extend beyond the surface of the power supply interface 210 and engage with a detent 448 on a surface of the fixation member 216. In some cases, the bias element 442 may be a spring. The retaining feature 436 may be secured to the power supply interface 210 by an engagement 444. For example, the retaining feature 436 may threadedly engage with the power supply interface 210 via the engagement 444.

The power supply 400 may provide power to the bicycle component. The power supply 400 may be recharged to replenish the energy stored in the power supply 400. In some cases, the power supply 400 may be charged outside of or uninstalled from the bicycle. For example, the thru-axle 200, including the power supply 400 disposed therein, may be removed from the bicycle 100 and the power supply 400 may be charged. In another example, the power supply 400 may be unscrewed from or otherwise removed from the thru-axle 200 (e.g. leaving the thru-axle 200 installed on the bicycle) and charged. In some other cases, the power supply interface 210 may be removed to charge the power supply 400. For example, the power supply interface 210 may be uninstalled from the bicycle, and a charger may be introduced in the space formerly occupied by the power supply interface 210 to charge the power supply 400. In still some other cases, the power supply 400 may be charged using the component interface 212. For example, the component interface 212 may be removed or uninstalled from the component and the charger may be fitted to the component interface 212 to charge the power supply 400. Because the component interface 212 may be compatible with traditional battery systems (e.g. batteries mounted directly to the components), the power supply 400 may be charged via the component interface 212 with a charger designed or compatible with traditional battery systems.

Figure 10:
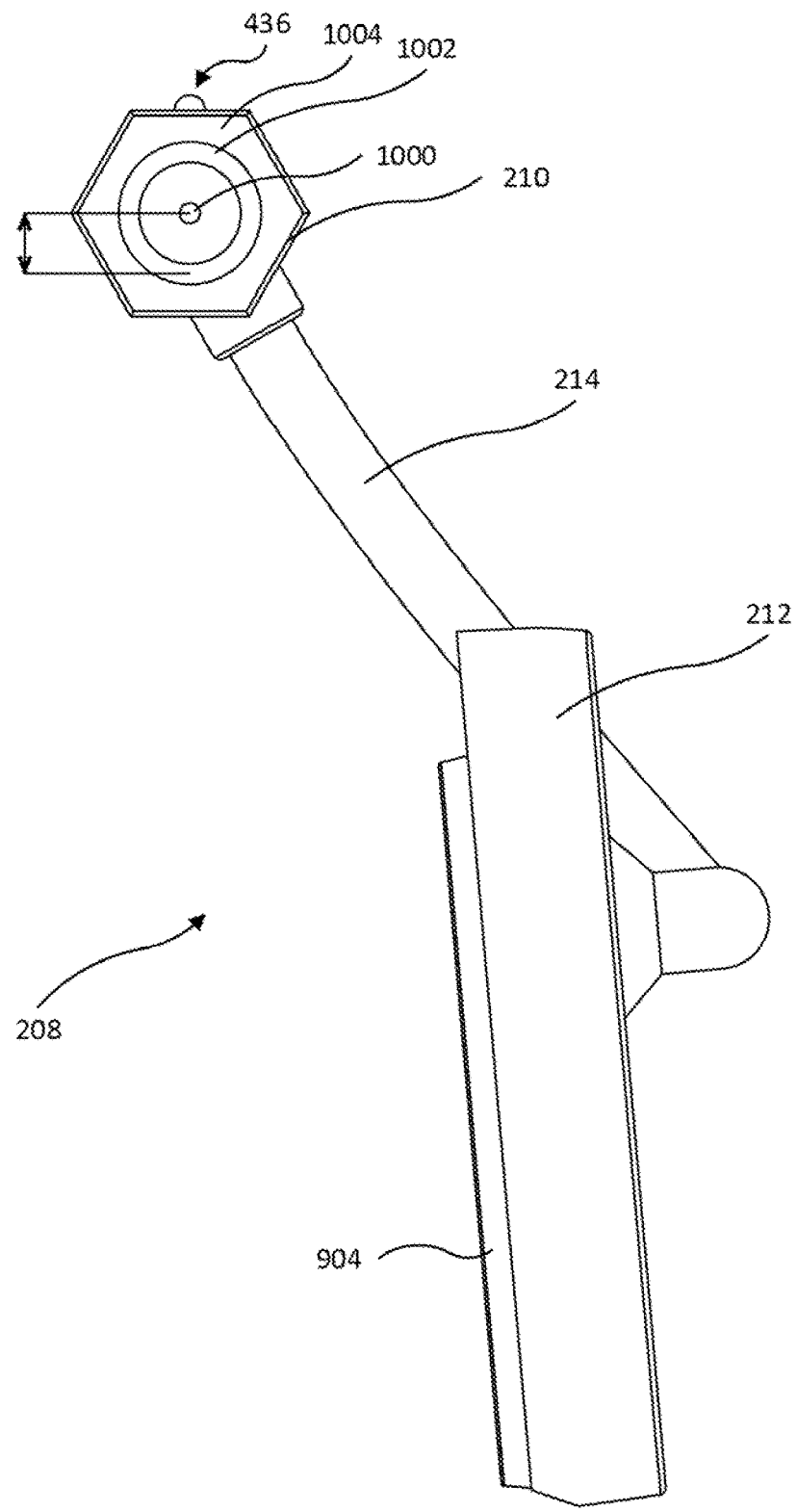
FIG. 10 is a side view of the power supply and connector of FIG. 9.

Referring to FIGS. 6A and 6B, the thru-axle 200 with the power supply 400 installed therein is shown. An axis 600 of the thru-axle 200 is shown. The axis 600 may define a center line of the thru-axle 200. The first electrical contact 418 of the power supply 400 may be disposed substantially on or about the axis 600. The second electrical contact 420 may be spaced at a distance from the first electrical contact 418 and/or the axis 600. For example, the second electrical contact 420 may be spaced at a radial distance from the first electrical contact 418. The distance between the first electrical contact 418 and the second electrical contact 420 may correspond to the distance between the second electrical contact 1002 and the first electrical contact 1000 of the power supply interface 210 (e.g. as shown in FIG. 10). For example, the second electrical contact 420 may be spaced 3 mm radially from the first electrical contact 418. In some cases, the distance between the second electrical contact 1002 and the first electrical contact 1000 of the power supply interface 210 may be equal to or less than the distance between the first electrical contact 418 and the second electrical contact 420. For example, the distance between a center of the first electrical contact of the power supply interface 210 and the center line of the second electrical contact of the power supply interface 210 may be equal to or less than the distance between the first electrical contact 418 and the second electrical contact 420.

Figure 7:
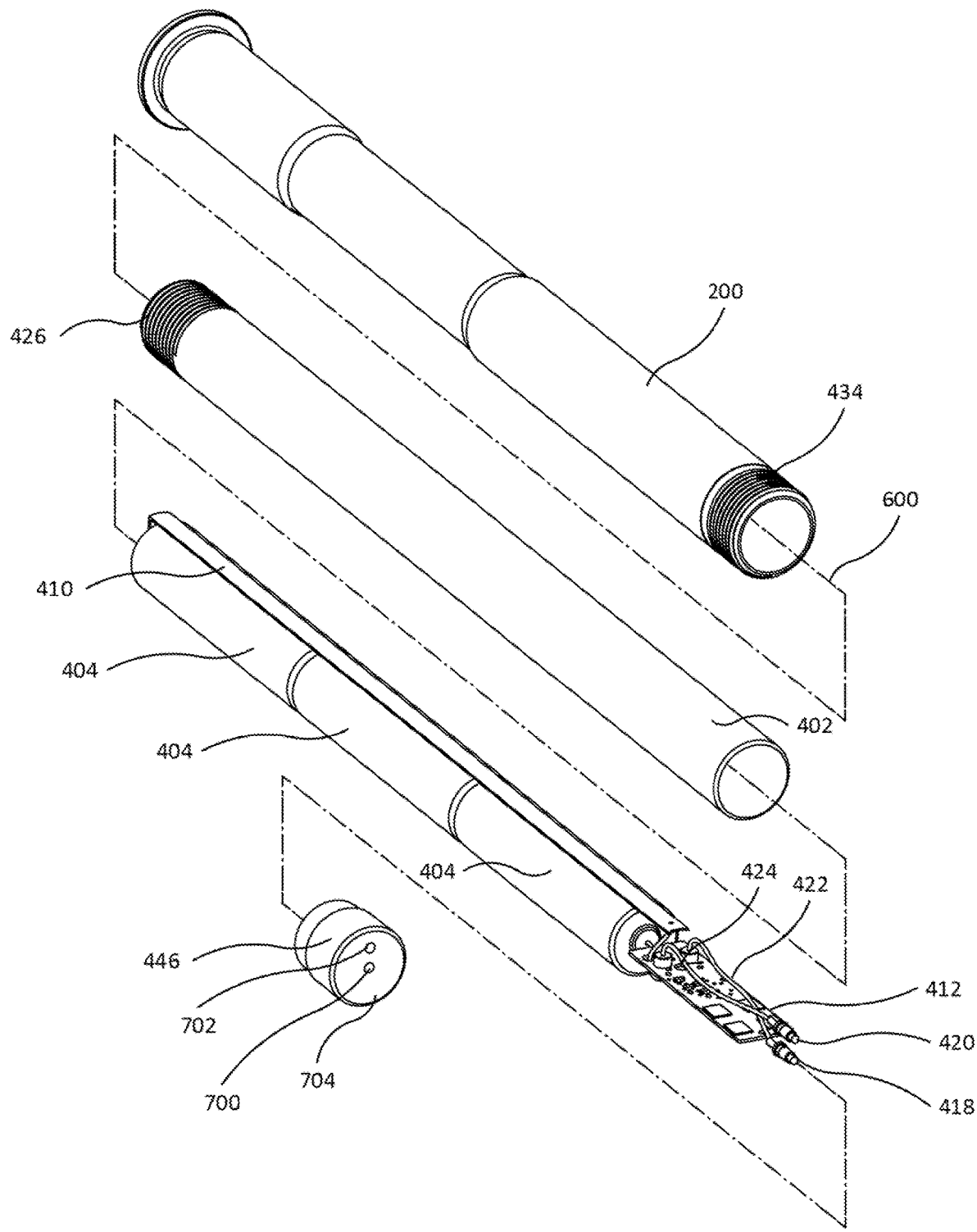
FIG. 7 is an exploded view of the thru-axle power supply of FIG. 2 without the bracket or derailleur installed.
Figure 8:
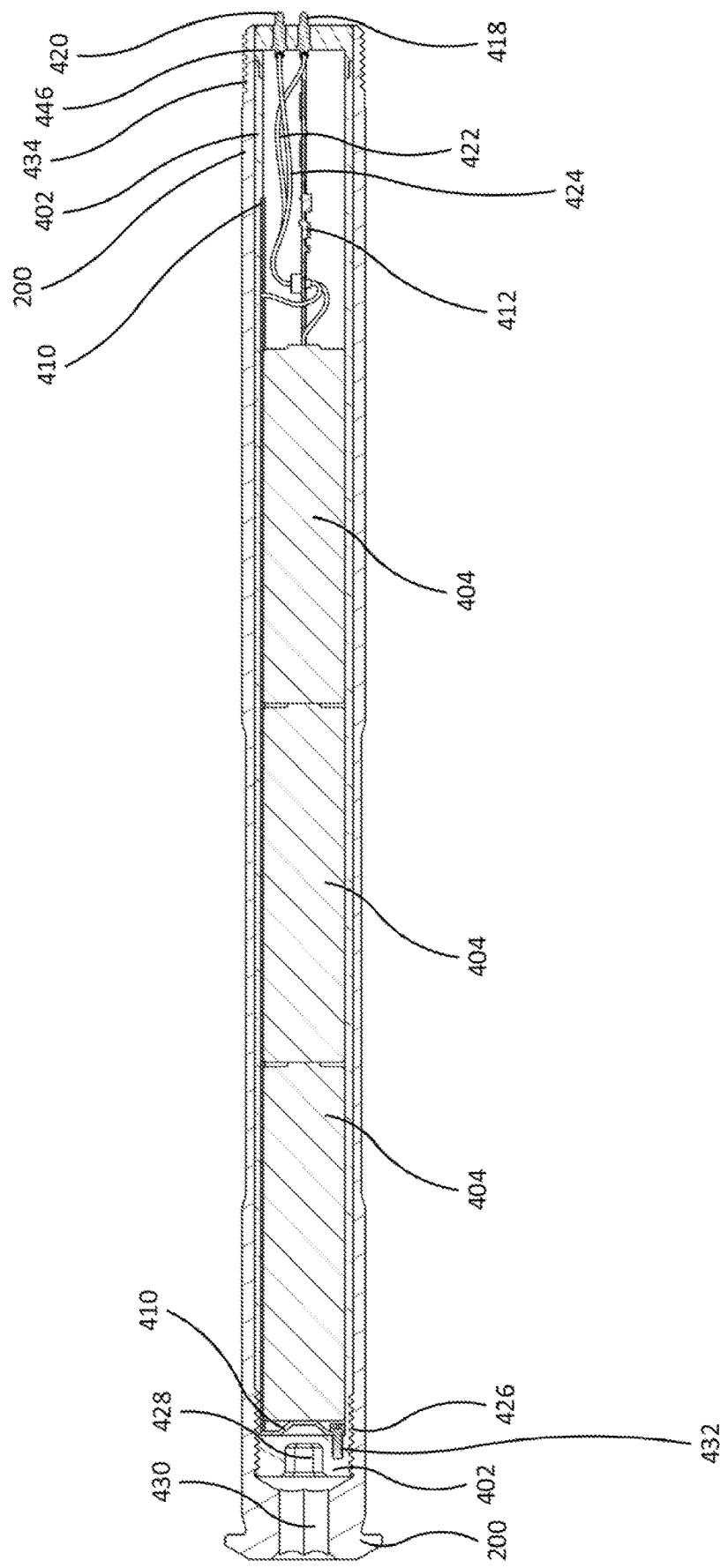
FIG. 8 is a cross-sectional view of the thru-axle power supply of FIG. 2 without the bracket or derailleur installed.

Referring to FIG. 7, the assembly of the power supply 400 within the thru-axle 200 is shown. The end cap 446 of the power supply 400 may have a first aperture 700. In some cases, the end cap 446 may have a second aperture 702. When the end cap 446 is installed on the power supply 400, the first electrical contact 418 may extend through the first aperture 700. The first electrical contact 418 may extend though the first aperture 700 and protrude beyond a face 704 of the end cap 446. In some cases, the second electrical contact 420 may extend through the second aperture 702 and protrude beyond the face 704 of the end cap 446. In this way, when the power supply interface 210 is installed on the power supply 400, the first electrical contact 418 and/or the second electrical contact 420 may contact the coordinating electrical contacts of the power supply interface 210.

Figure 9:
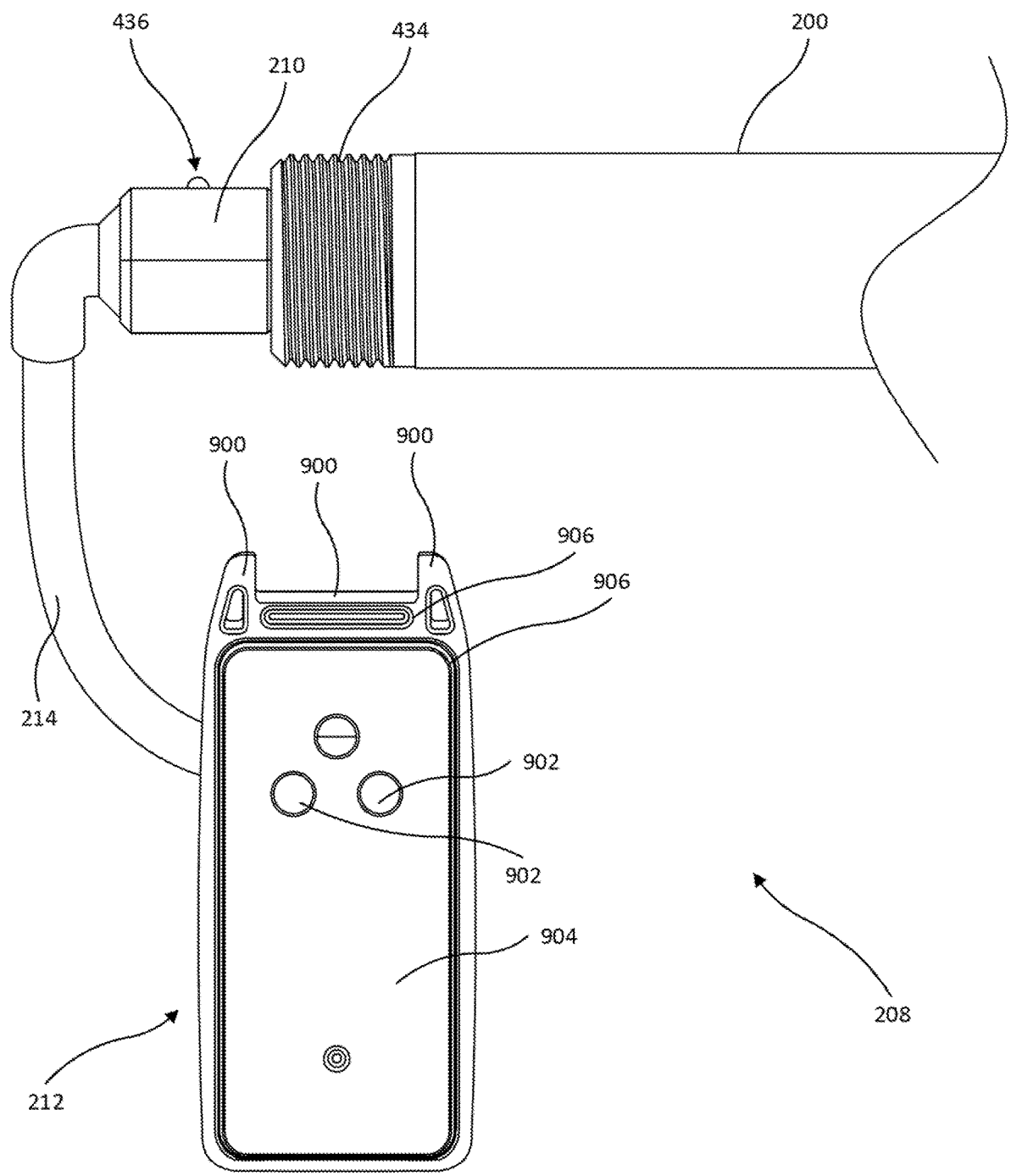
FIG. 9 is a detail view of the power supply and connector of FIG. 2.

Referring to FIG. 9, the connector 208 is shown in greater detail. The component interface 212 may include one or more retaining features 900. The retaining features 900 may enable securing the component interface 212 to the bicycle component (e.g. a derailleur 124). The retaining features 900 may interface with the fixation member 218. For example, the fixation member 218 may clip onto one or more of the retaining features 900 and secure the component interface 212 to the component.

The component interface 212 may include one or more electrical contacts 902. The electrical contacts 902 may facilitate the exchange of power and/or data between the power supply 400 and the component. The electrical contacts 902 may be disposed on a joining surface 904 of the connector 208. When the component interface 212 is secured to the component, the joining surface 904 may be disposed against the component (e.g. may abut the component).

One or more seals 906 may be present on the component interface 212. For example, the seals 906 may be disposed on the joining surface 904 or the retaining features 900. The seals 906 may prevent ingress of water and dust. In some cases, the seals may enclose or encircle the electrical contacts 902.

Referring to FIG. 10, a different portion of the connector 208 is shown in greater detail. The power supply interface 210 may include a first electrical connector 1000. In some cases, the power supply interface 210 may also include a second electrical connector 1002.

When the power supply interface 210 is installed on the power supply 400, the first electrical connector 1000 may contact the first electrical contact 418 of the power supply 400. In some cases, when the power supply interface 210 is installed on the power supply 400, the second electrical connector 1002 may contact the second electrical contact 420 of the power supply 400. The first electrical connector 1000 may be disposed in the center of a face 1004 of the power supply interface 210. In this way, when the power supply interface 210 is installed on the power supply 400, the first electrical connector 1000 may be disposed on the central axis 600 of the power supply 400, or co-axially with the first electrical contact 418 of the power supply 400.

The second electrical connector 1002 may be disposed at a distance from the first electrical connector 1000. In some cases, the second electrical connector 1002 may form an electrical pad or track. The second electrical connector 1002 may form an arc or circle substantially centered about the first electrical connector 1000.

The position (e.g. radial position) of the power supply 400 is dependent on the first engagement 426 securing the housing 402 to the thru-axle 200 and the second engagement 434 securing the thru-axle 200 to the fixation member 216. As a result, the position of the first electrical contact 418 and the second electrical contact 420 of the power supply 400 may vary depending on the engagements 426, 434. For example, misalignment of the engagements 426, 434 may make the radial position of the power supply 400 uncertain. By disposing a first electrical connector 1000 at the center of the power supply interface 210 and the second electrical connector 1002 at a distance (e.g. radially outward) from the first electrical connector 1000, a connection between the power supply 400 and the power supply interface 210 may be enabled regardless of the radial position of the power supply 400. As the first electrical contact 418 of the power supply 400 and the first electrical connector 1000 of the power supply interface 210 may be disposed on a central axis 600 of the power supply 400, an electrical connection may be established between the first electrical contact 418 and the first electrical connector 1000 at any radial position of the power supply 400. Though the position of the second electrical contact 418 of the power supply 400 may move depending on the radial position of the power supply 400, by disposing the second electrical connector 1002 radially outward from the first electrical connector 1000, an electrical connection may be established between the second electrical contact 420 and the second electrical connector 1002 at any radial position of the power supply 400.

Figure 11:
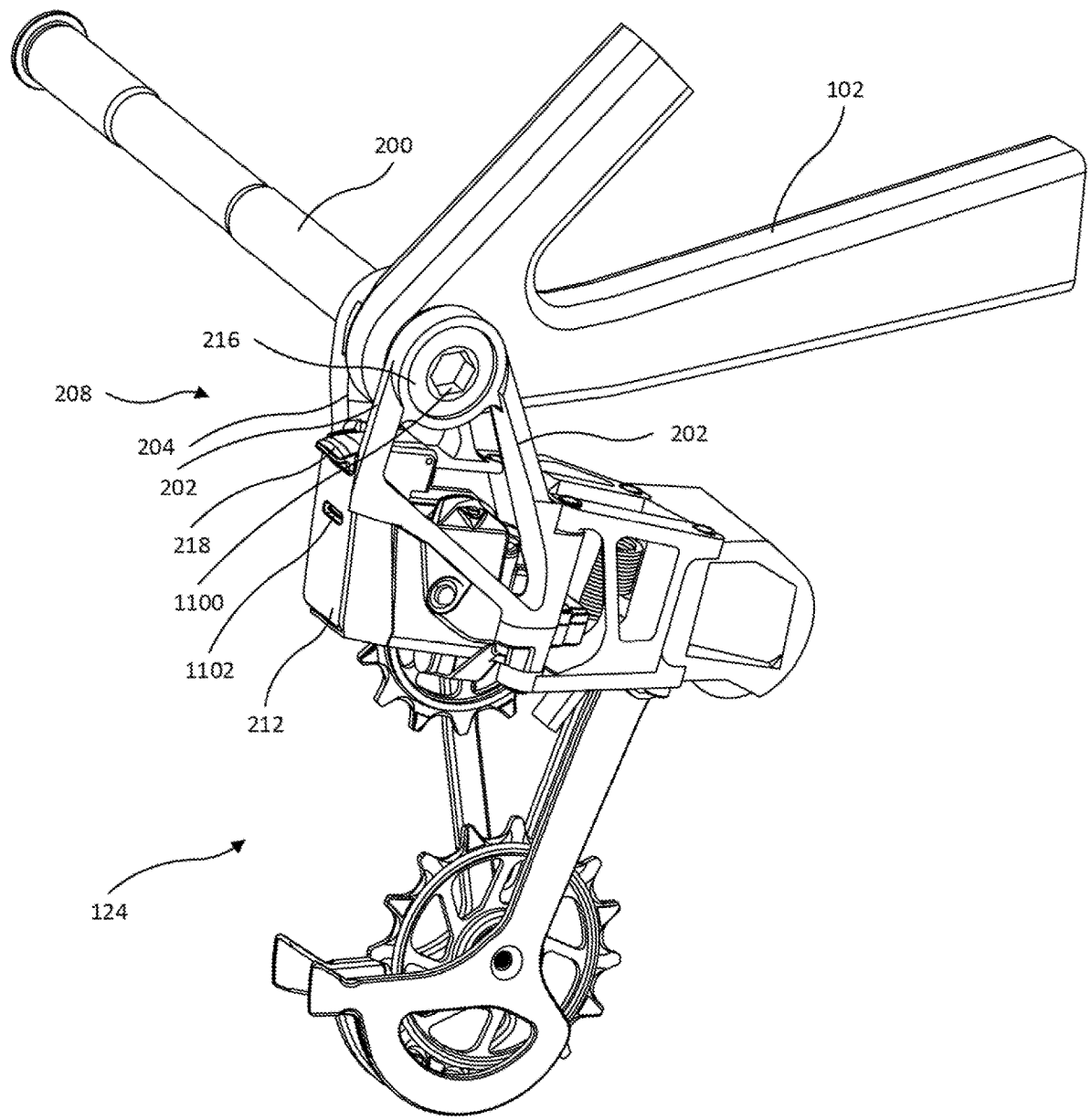
FIG. 11 is a perspective view of another embodiment of a thru-axle power supply, bracket, and derailleur in accordance with the teachings of this disclosure.

Referring to FIG. 11, another embodiment of the power supply 400 and connector 208 is shown. In this embodiment, the conductive paths contained in the cable 214 (e.g. as described with respect to FIG. 2) may be routed through the bracket 202. In this case, the connector 208 may not include the power supply interface 210 and cable 214.

With the power supply interface 210 omitted, a tooled socket 1100 in the fixation member 216 is shown. The tooled socket 1100 may allow for insertion of a tool into the fixation member 216. For example, a tool inserted in the fixation member 216 may allow for rotation of the fixation member 216. Rotation of the fixation member may engage or disengage the fixation member 216 and the thru-axle 200 (e.g. via engagement 434). The tooled socket 1100 may be present in the fixation member 216 regardless of whether or not the connector 208 includes a power supply interface 210.

A port 1102 may be disposed on the connector 208. In some cases, the port 1102 may be dimensioned according to a standard. For example, the port 1102 may conform to the USB type C standard. The port 1102 may allow for charging of the power supply 400. For example, a charger may plug into the port 1102 to charge the power supply 400.

Figure 12:
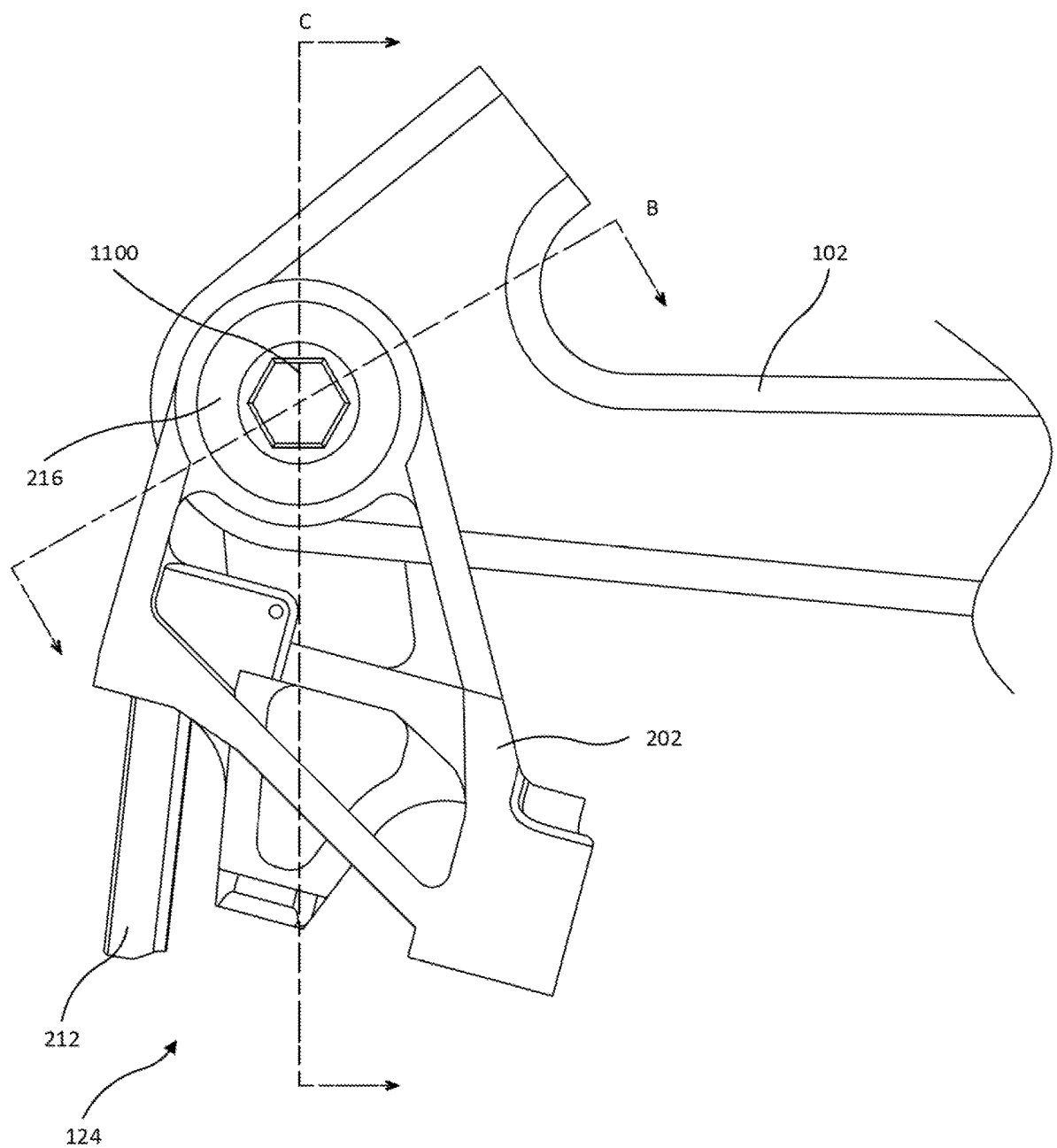
FIG. 12 is a side view of the thru-axle power supply and bracket of FIG. 11 without the derailleur installed.
Figure 13:
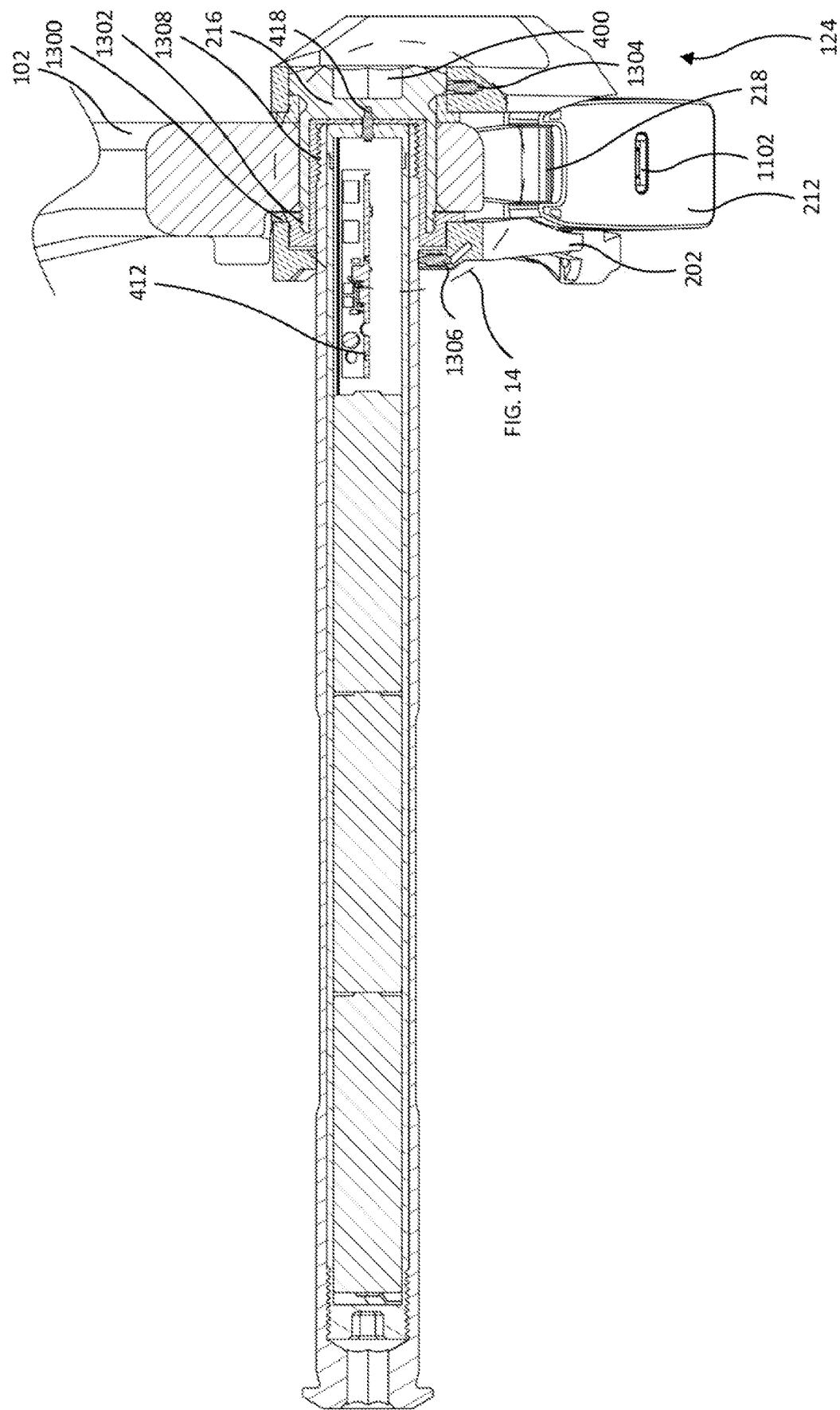
FIG. 13 is a first cross-sectional view of the thru-axle power supply and bracket of FIG. 12.
Figure 14:
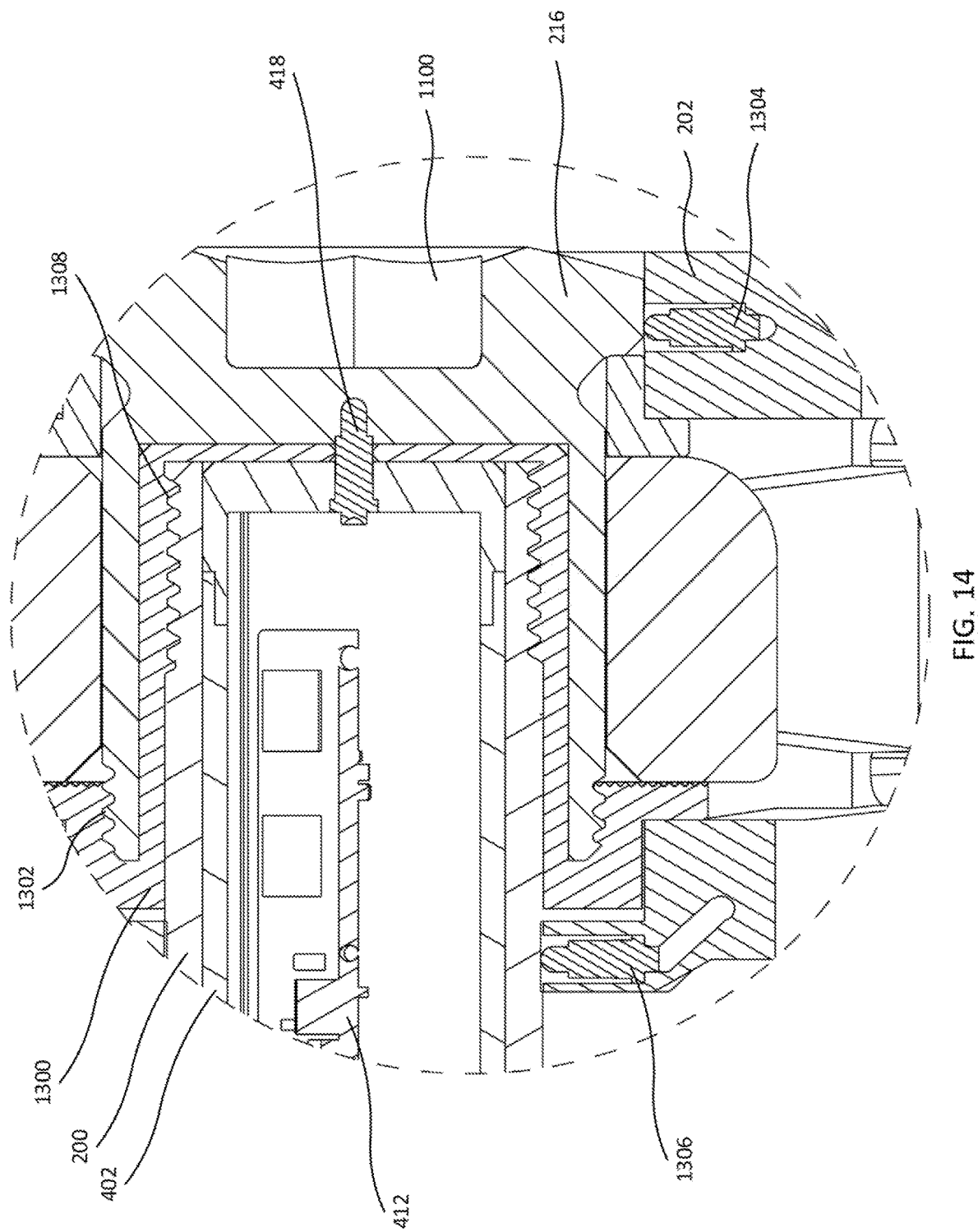
FIG. 14 is a detail view of the thru-axle power supply and bracket of FIG. 13.
Figure 15:
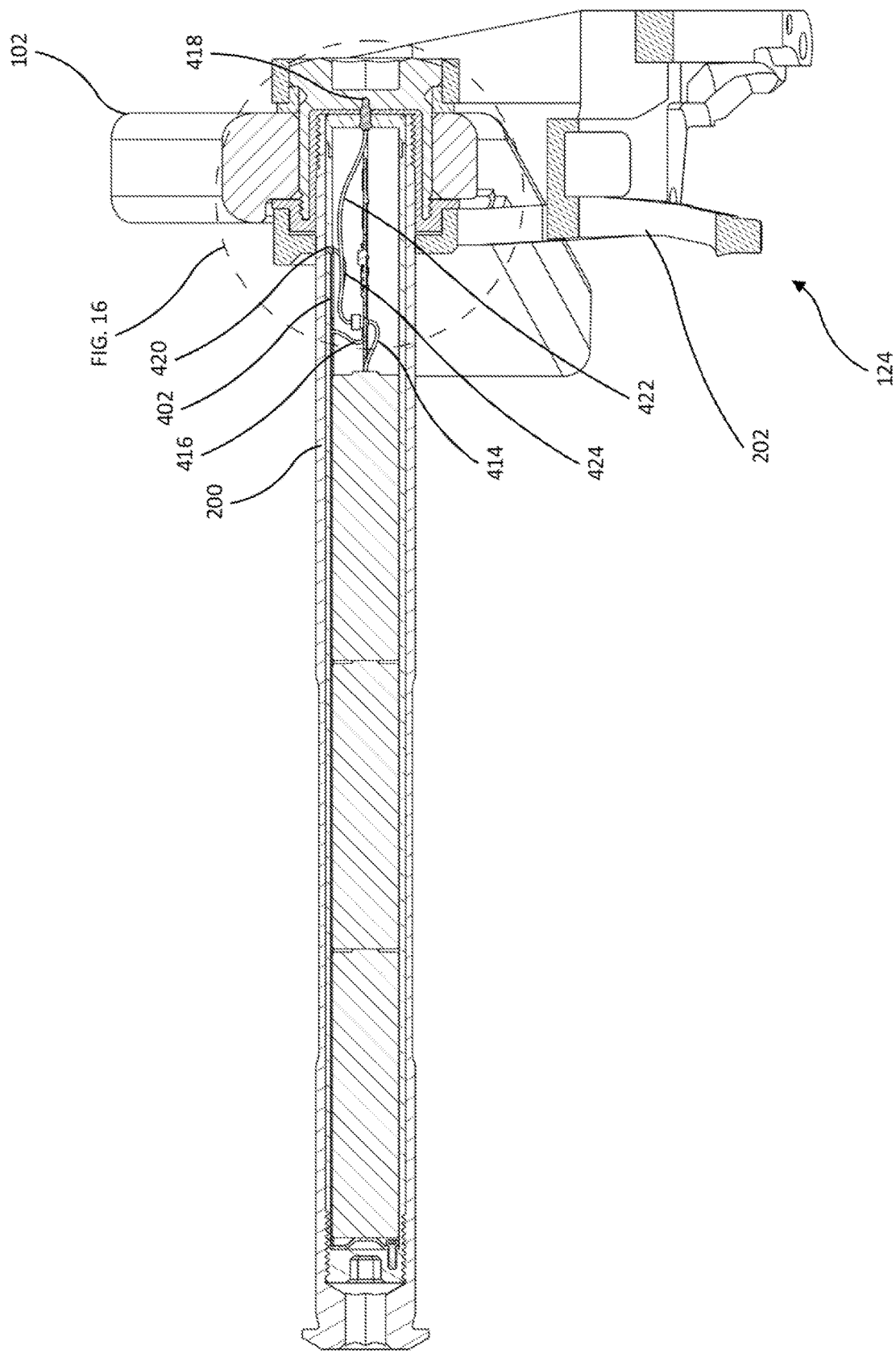
FIG. 15 is a second cross-sectional view of the thru-axle power supply and bracket of FIG. 12.

Referring to FIG. 12, a profile view of the connector 208, fixation member 216, and bracket 202 is shown. Cross sections B and C correspond to FIGS. 13 and 15, respectively.

Referring to FIGS. 13-16, the power supply 400 and bracket 202 are shown in detail. An insulation member 1300 may be disposed between the power supply 400 and the fixation member 216. The insulation member 1300 may be secured to the fixation member 216 via an engagement 1302. For example, the engagement 1302 may be a threaded engagement between the insulation member 1300 and the fixation member 216. The insulation member 1300 may be secured to the thru-axle 200 via an engagement 1308. For example, the engagement 1308 may be a threaded engagement between the insulation member 1300 and the thru-axle 200. The first electrical contact 1304 is in electrical communication with the fixation member 216. A second electrical contact 1306 is in electrical communication with the housing 402. Other configurations may be provided.

The insulation member 1300 may be made from an electrically insulating material, such as plastic. In some embodiments, a first conductive path may pass through the fixation member 216 and a second conductive path may pass through the housing 402 and the thru-axle 200. The insulation member 1300 may be disposed between the thru-axle 200 and the fixation member 216 to electrically insulate the conductive paths from one another. For example, without the insulation member 1300, a short circuit may form across the electrical contacts 418, 420 of the power supply 400 if the fixation member 216 is in contact with the thru-axle 200. An opening may be present in the insulation member 1300 to allow the first electrical contact 418 of the power supply 400 to extend through the insulation member 1300 and contact the fixation member 216. In some cases, the insulation member 1300 may be installed or disposed in substantially the same way as the inboard retaining feature 436 of FIG. 4.

The first electrical contact 1304 may be disposed in the bracket 202. For example, the first electrical contact 1304 may be disposed on a portion of the bracket 202 that is outboard of the frame 102. In some cases, the first electrical contact 1304 may be a retractable pin. The first electrical contact 1304 may form part of a conductive path extending between the power supply 400 and the component. For example, power may be conducted from the first electrical contact 418 of the power supply 400, through the fixation member 216, through the first electrical contact 1304, and on to the component via an internal conductive routing (shown in FIG. 19).

The second electrical contact 1306 may be disposed in the bracket 202. For example, the second electrical contact 1306 may be disposed on a portion of the bracket 202 that is inboard of the frame 102. The second electrical contact 1306 may be a retractable pin. The second electrical contact 1306 may form part of a conductive path extending between the power supply 400 and the component. For example, referring to FIGS. 15 and 16, power may be conducted from the second electrical contact 420 of the power supply 400, through the housing 402, through the thru-axle 200, through the second electrical contact 1306, and on to the component via an internal conductive routing (shown in FIG. 19).

Figures 17A, 17B:
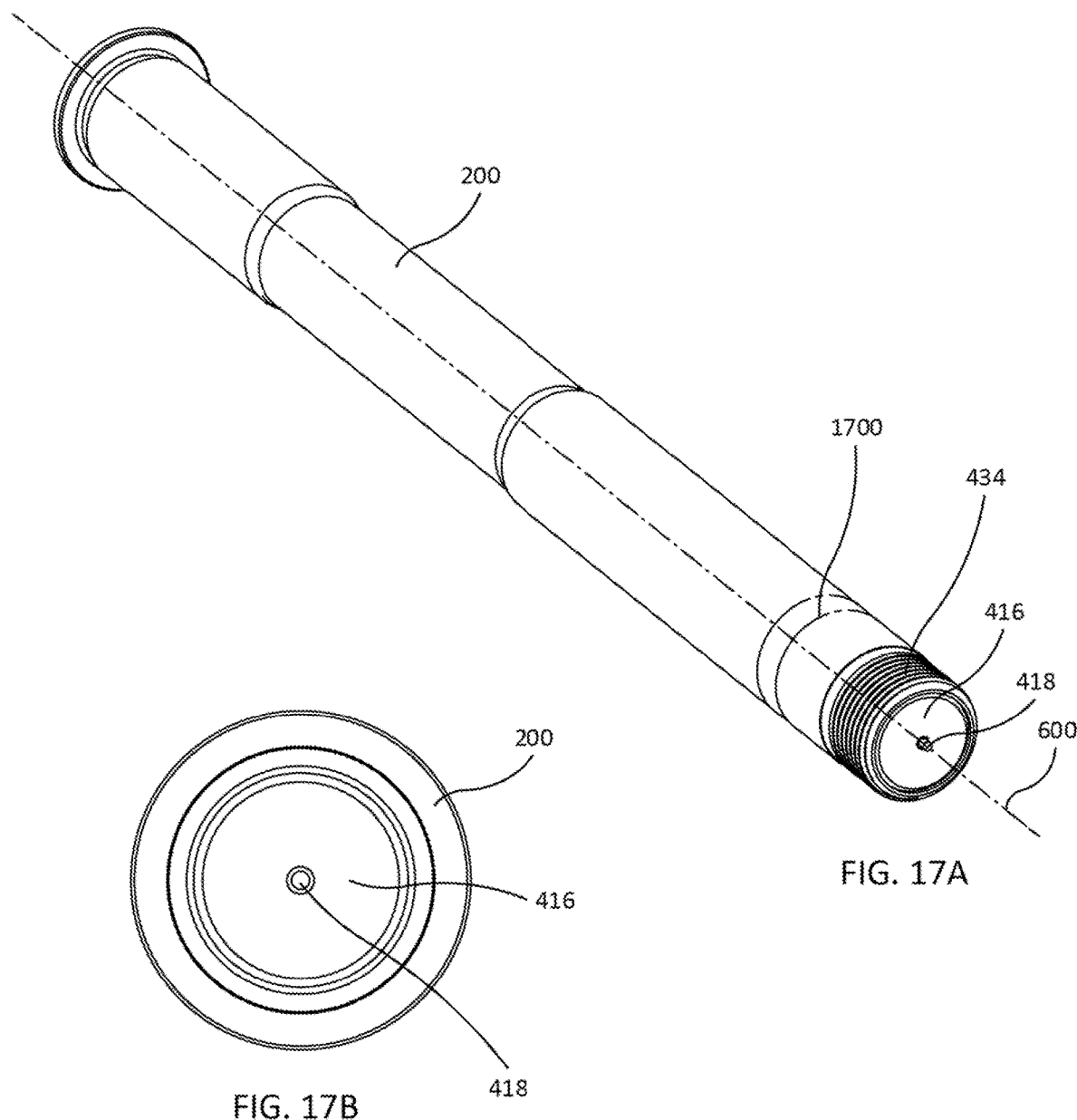
FIG. 17A is a perspective view of the thru-axle power supply of FIG. 11 without the bracket or derailleur installed.
FIG. 17B is a front view of the thru-axle power supply of FIG. 11 without the bracket or derailleur installed.

Referring to FIGS. 17A and 17B, the power supply 400 and the thru-axle 200 are shown in detail. As with the embodiment shown in FIG. 6, the first electrical contact 418 may be disposed substantially along the central axis 600 of the power supply 400. The second electrical contact 420 (shown in FIG. 18), is disposed substantially at the circumferential surface of the power supply 400. In this way, the second electrical contact 420 may contact the thru-axle 200.

Anodization may be applied to the thru-axle 200. For example, anodizing the surface of the thru-axle 200 may retard or prevent corrosion. However, the anodization may inhibit the ability of the thru-axle 200 to conduct electricity. Because a conductive path may pass through the thru-axle 200 (e.g. from the second electrical contact 420 of the power supply 400, through the thru-axle 200, and to the second electrical contact 1306 of the bracket 202), in some cases, a portion 1700 of the thru-axle 200 may be non-anodized. Power from the second electrical contact 420 of the power supply 400 may be conducted through the non-anodized portion 1700. The non-anodized portion 1700 may form a band on the circumferential surface of the thru-axle 200. The non-anodized portion 1700 may be laterally disposed on the thru-axle 200 as to contact the second electrical contact 1306 of the bracket 202.

Figure 18:
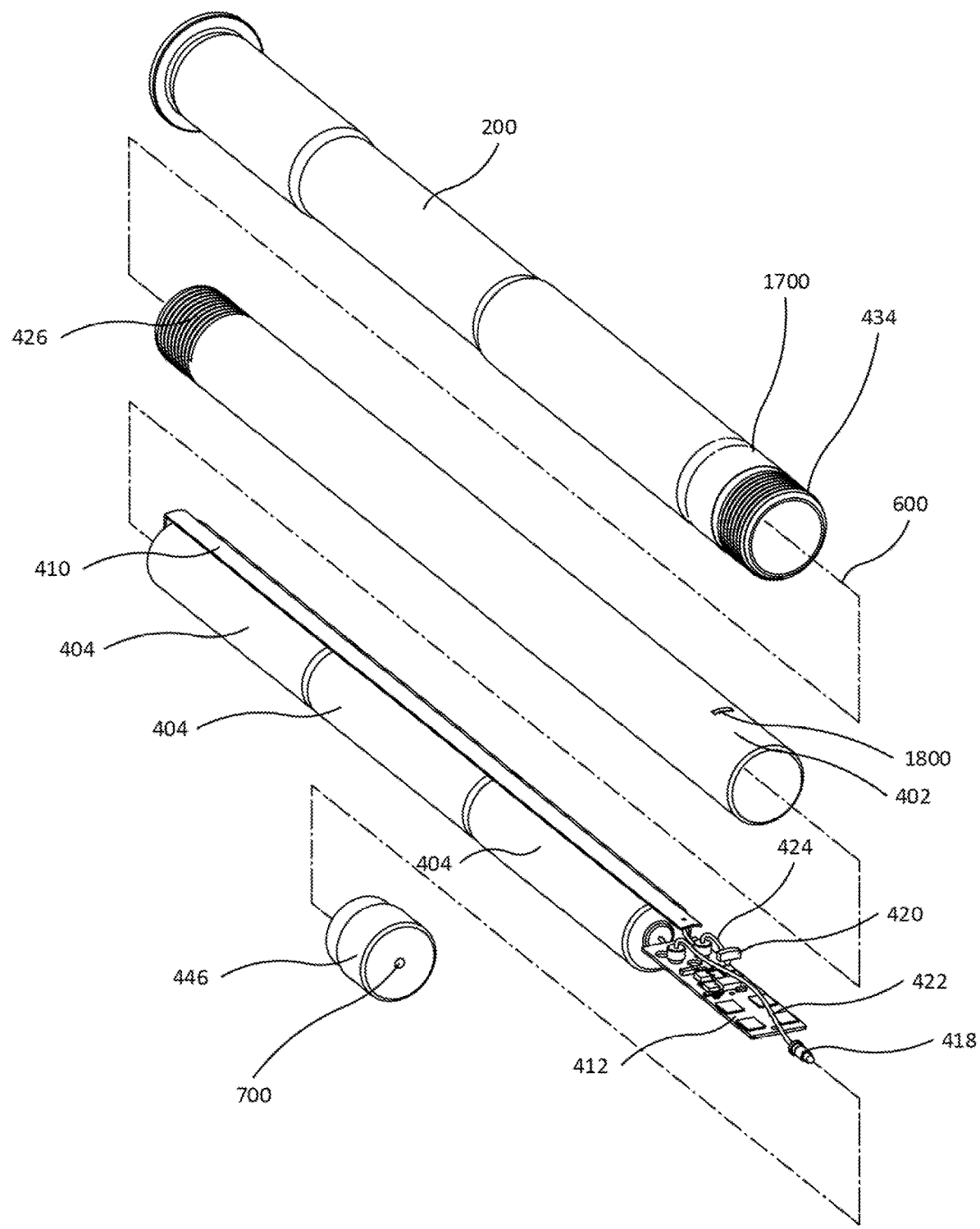
FIG. 18 is an exploded view of the thru-axle power supply of FIG. 11 without the bracket or derailleur installed.

Referring to FIG. 18, an assembly of the thru-axle 200 and the power supply 400 is shown. The housing 402 of the power supply 400 may have an aperture 1800. The second electrical contact 420 may be disposed in the aperture 1800. In this way, the second electrical contact 420 may contact the thru-axle 200 when the power supply 400 is installed in the thru-axle 200.

Figure 19:
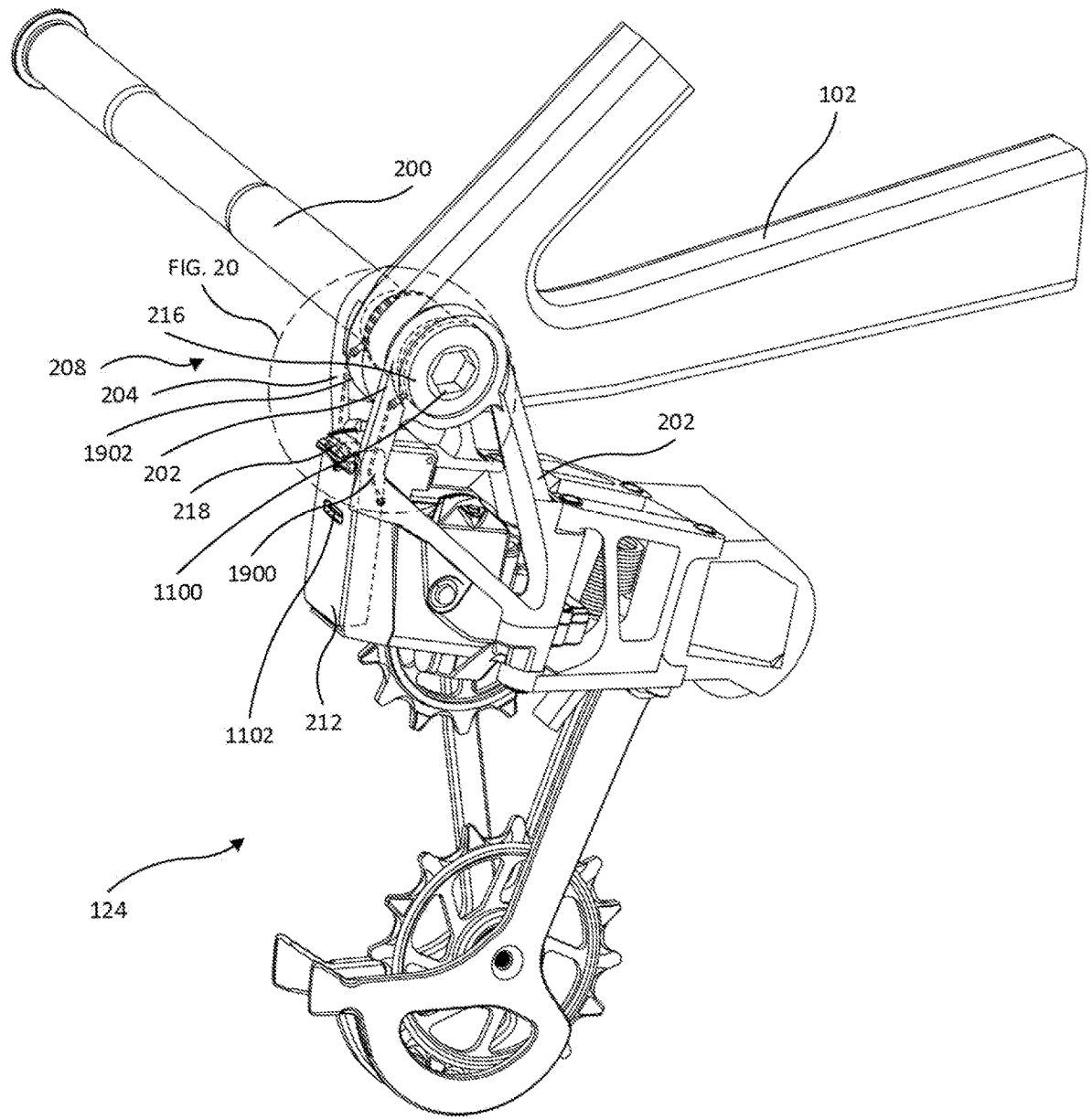
FIG. 19 is a second perspective view of the thru-axle power supply, bracket, and derailleur of FIG. 11 with internal routings shown.
Figure 20:
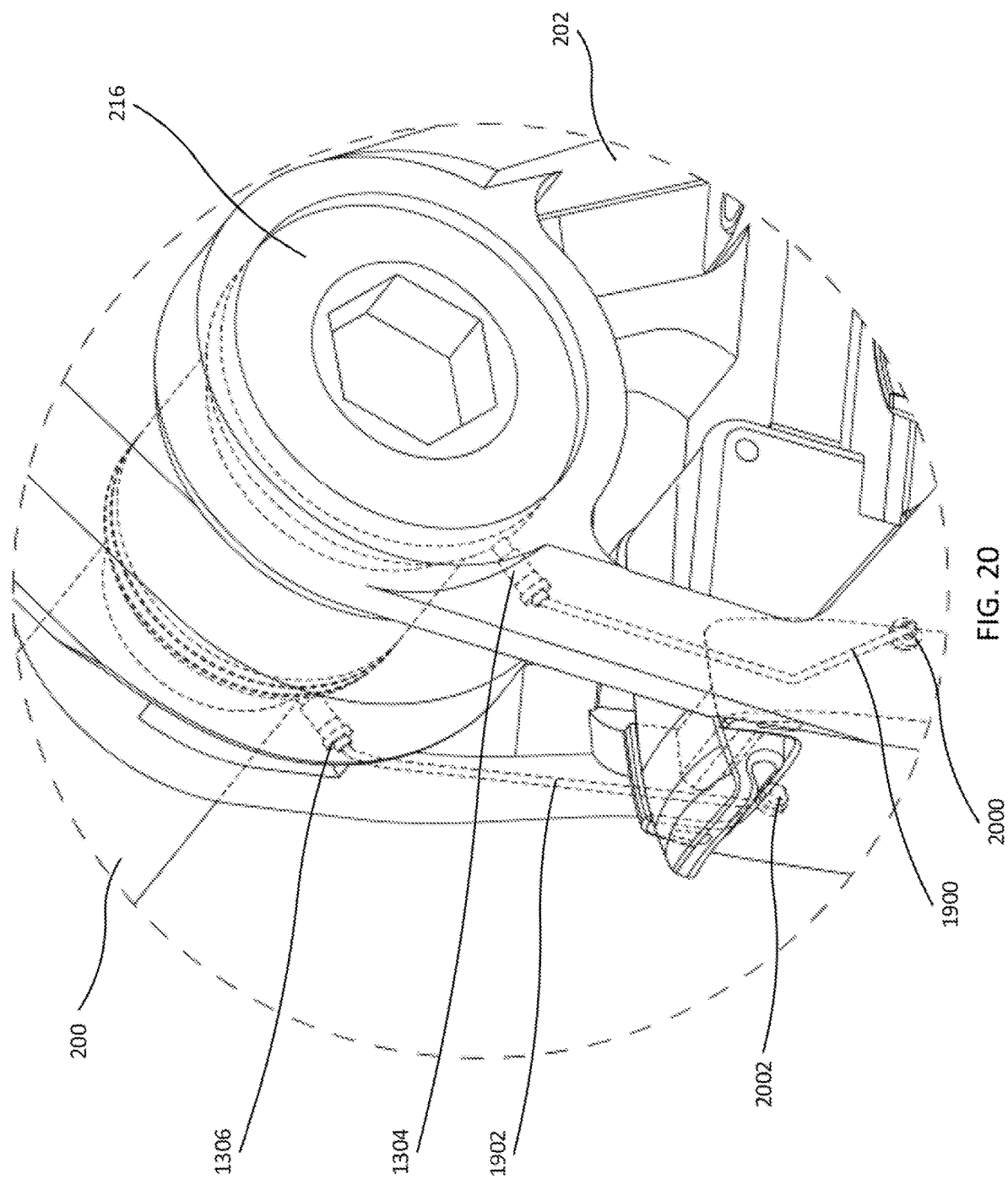
FIG. 20 is a detail view of the thru-axle power supply, bracket, and derailleur of FIG. 19.
Figure 21:
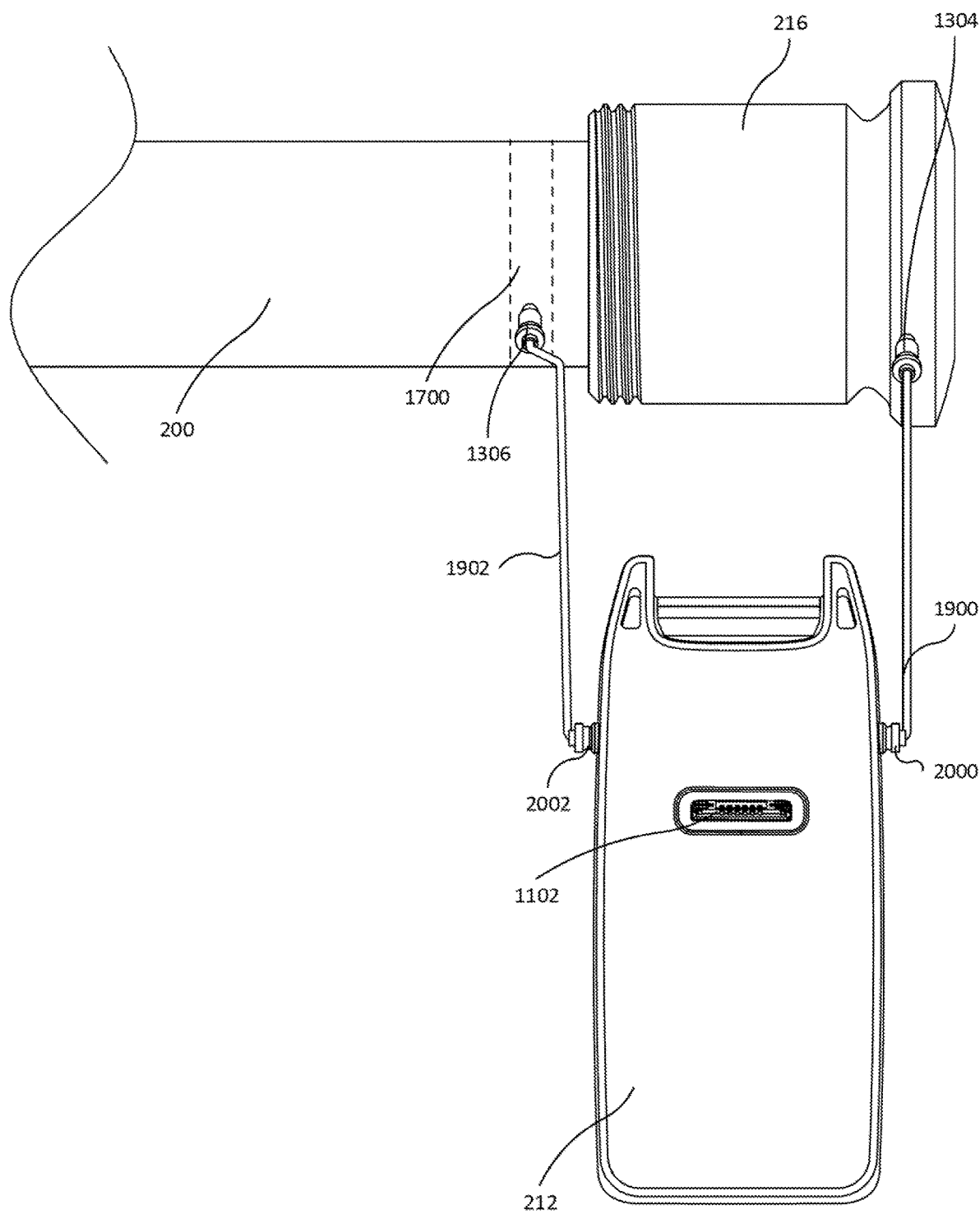
FIG. 21 is a side view of the thru-axle power supply and connector of FIG. 19 without the bracket and derailleur installed.

Referring to FIGS. 19-21, the thru-axle 200, bracket 202, and derailleur 124 are shown in detail. A first internal routing 1900 and a second internal routing 1902 (shown with dashed lines in FIGS. 19 and 20) may be disposed within the bracket 202. The internal routings 1900, 1902 may be conductive. For example, the internal routings 1900, 1902 may be electrical traces or wires disposed inside the bracket 202.

The first internal routing 1900 may be in electrical communication with the first electrical contact 1304 of the bracket 202 and the component interface 212 of the connector 208. In some cases, the first internal routing 1900 may be in electrical communication with the component interface 212 via a first conductive fitting 2000. The first conductive fitting 2000 may be disposed in the bracket 202.

The second internal routing may be in electrical communication with the second electrical contact 1306 of the bracket 202 and the component interface 212 of the connector 208. In some cases, the second internal routing 1902 may be in electrical communication with the component interface 212 via a second conductive fitting 2002. The second conductive fitting 2002 may be disposed in the bracket 202.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, more or fewer battery cells may be used than shown in the figures. In another example, the power supply may be configured to provide power to a seat post, bicycle lighting, an air pump, a GPS transponder, a shock, or other component. In still a further example, the power supply may be disposed in a thru-axle of a front wheel of the bicycle. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations and/or acts are depicted in the drawings and described herein in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that any described program components and systems can generally be integrated together in a single software product or packaged into multiple software products.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, are apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

It is intended that the foregoing detailed description be regarded as illustrative rather than limiting and that it is understood that the following claims including all equivalents are intended to define the scope of the invention. The claims should not be read as limited to the described order or elements unless stated to that effect. Therefore, all embodiments that come within the scope and spirit of the following claims and equivalents thereto are claimed as the invention.

What is claimed is:

1. A power supply system for a component of a bicycle, the power supply system comprising:

an energy storage unit positionable in an axle of the bicycle, the energy storage unit comprising a first electrical contact and a second electrical contact spaced apart from the first electrical contact;

a connector configured to electrically and mechanically connect the energy storage unit to the component of the bicycle;

a first conductive path extending from the energy storage unit to the component of the bicycle via the first electrical contact and the connector; and a second conductive path extending from the energy storage unit to the component of the bicycle via the second electrical contact and the connector, wherein the energy storage unit comprises a housing, in which the energy storage unit is positionable, the first electrical contact and the second electrical contact are supported by the housing, and the first electrical contact is disposed on a circumferential surface of the housing of the energy storage unit.

2. The power supply system of claim 1, wherein the first electrical contact extends beyond an axial end of the housing.

3. The power supply system of claim 1, wherein the first electrical contact and the second electrical contact are laterally disposed between a first plane defined by a first outer surface of a mounting support for the component and a second plane defined by a second outer surface of the mounting support opposite the first outer surface.

4. The power supply system of claim 1, further comprising an axle of the bicycle, the axle having a circumferential surface, wherein the first electrical contact is in electrical communication with a portion of the circumferential surface of the axle.

5. The power supply system of claim 4, wherein the portion of the circumferential surface of the axle is a non-anodized portion of the circumferential surface of the axle.

6. The power supply system of claim 4, wherein the connector is electrically connectable to the energy storage unit via the axle, a fixing member of the axle, or the axle and the fixing member of the axle.

7. The power supply system of claim 1, wherein the energy storage unit further comprises:

a printed circuit board disposed within and supported by the housing of the energy storage unit; and a power management circuit supported by the printed circuit board and electrically connectable to a power source of the energy storage unit.

8. The power supply system of claim 1, wherein the connector is electrically connectable to an input electrical contact of the component of the bicycle.

9. A power supply for a bicycle component, the power supply comprising:

a housing that is positionable within a thru-axle configured to be disposed along a rotational wheel axis of the bicycle, the housing being configured to support one or more power sources;

a first electrical contact and a second electrical contact spaced apart from the first electrical contact, the first electrical contact and the second electrical contact being supported by the housing and disposed at an exial end of the power supply, wherein the one or more power sources are electrically connectable to the bicycle component via a first conductive path and a second conductive path, wherein the first conductive path extends from the one or more power sources to the bicycle component, via the first electrical contact, and wherein the second conductive path extends from the one or more power sources to the bicycle component, via the second electrical contact, wherein the first electrical contact is disposed coaxially with the thru-axle on the rotational wheel axis and the second electrical contact is disposed at a radial distance from the first electrical contact in a radial direction extending away from the rotational wheel axis.

10. A derailleur assembly for a bicycle, the derailleur assembly comprising:

a derailleur;

an energy storage unit positionable in an axle of the bicycle at a wheel axis, the energy storage unit including a first electrical contact disposed in the axle at the wheel axis and a second electrical contact spaced apart from the first electrical contact in a radial direction; and a connector configured to electrically connect the energy storage unit to the derailleur, the connector having a third electrical contact disposed in a center of an internal space of the connector, and a fourth electrical contact annularly disposed radially outward of the third electrical contact, wherein a first conductive path extends from the energy storage unit to the derailleur via the first electrical contact and the third contact of the connector, and wherein a second conductive path extends from the energy storage unit to the derailleur via the second electrical contact and the fourth electrical contact of the connector.

* * * * *